(12) United States Patent
Dong

(10) Patent No.: US 12,453,267 B2
(45) Date of Patent: Oct. 21, 2025

(54) DISPLAY PANEL AND DISPLAY DEVICE

(71) Applicant: Shanghai Tianma Micro-Electronics Co., Ltd., Shanghai (CN)

(72) Inventor: Dan Dong, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 512 days.

(21) Appl. No.: 18/076,017

(22) Filed: Dec. 6, 2022

(65) Prior Publication Data

US 2024/0040886 A1 Feb. 1, 2024

(30) Foreign Application Priority Data

Jul. 28, 2022 (CN) .......................... 202210900038.9

(51) Int. Cl.
 *H10K 59/38* (2023.01)
 *H10K 50/84* (2023.01)
(52) U.S. Cl.
 CPC ............. *H10K 59/38* (2023.02); *H10K 50/84* (2023.02)
(58) Field of Classification Search
 CPC ............................... H10K 59/38; H10K 50/84
 USPC ............................................................ 257/40
 See application file for complete search history.

(56) References Cited

U.S. PATENT DOCUMENTS

| | | | |
|---|---|---|---|
| 2019/0296088 A1* | 9/2019 | Kim | ...................... H10K 59/877 |
| 2020/0089047 A1* | 3/2020 | Baek | ................. G02F 1/133512 |
| 2020/0258946 A1* | 8/2020 | Kim | ...................... H10K 59/38 |

FOREIGN PATENT DOCUMENTS

CN 114283699 A 4/2022

* cited by examiner

*Primary Examiner* — Xia L Cross
(74) *Attorney, Agent, or Firm* — Anova Law Group, PLLC

(57) ABSTRACT

A display panel and a display device are provided. The display panel includes a display region including opening areas and a non-opening area; a substrate; and a light-emitting layer and a color filter layer. The light-emitting layer includes light-emitting elements located in the opening areas. The color filter layer includes color-resists. Along a first direction, the color-resists overlap with the light-emitting elements. One color-resist includes a first sub-section and a second sub-section. The first sub-section is located in a corresponding opening area and the second sub-section is located in the non-opening area. The color-resists include a first-type color-resist. In the first-type color-resist, along the first direction, the thickness of the first sub-section is smaller than the thickness of the second sub-section. The first direction is the thickness direction of the display panel.

20 Claims, 14 Drawing Sheets

DISPLAY PANEL AND DISPLAY DEVICE

CROSS-REFERENCE TO RELATED APPLICATION

This application claims the priority of Chinese Patent Application No. 202210900038.9, filed on Jul. 28, 2022, the content of which is incorporated herein by reference in its entirety.

TECHNICAL FIELD

The present disclosure generally relates to the field of display technologies and, more particularly, relates to a display panel and a display device.

BACKGROUND

From the cathode ray tube (CRT) era to the liquid crystal display (LCD) era, and to the emerging organic light-emitting diode (OLED) and light-emitting diode display era, the display industry has evolved significantly after decades of development from traditional mobile phones, tablets, TVs, and PCs, to the current electronic devices, such as smart wearable devices, VR, and in-vehicle displays. The display industry is inseparable from display technologies.

With the development of display technologies, the display effect of display products has been continuously improved, such that the application of display products has become more and more widely, and users have higher and higher requirements for the picture quality displayed by the display products. Some display regions of some display products have a problem with high reflectivity. Therefore, how to reduce the reflectivity of display products to further improve the display quality has become one of the technical problems to be solved.

SUMMARY

One aspect of the present disclosure provides a display panel. The display panel includes: a display region including a plurality of opening areas and a non-opening area; a substrate; and a light-emitting layer and a color filter layer on a side of the substrate. The light-emitting layer is disposed between the substrate and the color filter layer, and includes a plurality of light-emitting elements located in the plurality of opening areas. The color filter layer includes a plurality of color-resists. Along a first direction, the plurality of color-resists overlaps with the plurality of light-emitting elements. One of the plurality of color-resists includes a first sub-section and a second sub-section. The first sub-section is located in a corresponding one of the plurality of opening areas and the second sub-section is located in the non-opening area. The color-resists include a first-type color-resist. In the first-type color-resist, along the first direction, the thickness of the first sub-section is smaller than the thickness of the second sub-section. The first direction is the thickness direction of the display panel.

Another aspect of the present disclosure provides a display device. The display device includes a display panel. The display panel includes: a display region including a plurality of opening areas and a non-opening area; a substrate; and a light-emitting layer and a color filter layer on a side of the substrate. The light-emitting layer is disposed between the substrate and the color filter layer, and includes a plurality of light-emitting elements located in the plurality of opening areas. The color filter layer includes a plurality of color-resists. Along a first direction, the plurality of color-resists overlaps with the plurality of light-emitting elements. One of the plurality of color-resists includes a first sub-section and a second sub-section. The first sub-section is located in a corresponding one of the plurality of opening areas and the second sub-section is located in the non-opening area. The plurality of color-resists includes a first-type color-resist. In the first-type color-resist, along the first direction, the thickness of the first sub-section is smaller than the thickness of the second sub-section. The first direction is the thickness direction of the display panel.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
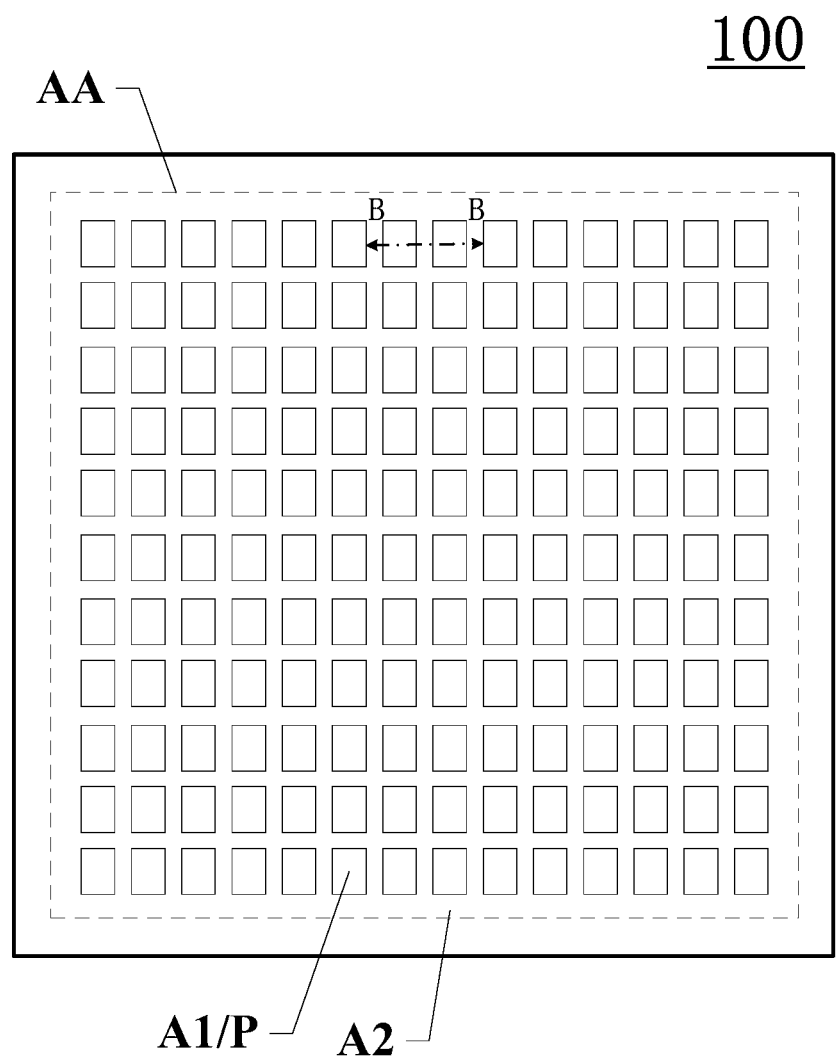
FIG. 1 illustrates an exemplary structure of a display panel consistent with various disclosed embodiments of the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width, and depth should be considered during practical fabrication.

The present disclosure provides a display panel. The display panel may include a display region including opening areas and a non-opening area; a substrate; and a light-emitting layer and a color filter layer disposed on a side of the substrate. The light-emitting layer may be disposed between the substrate and the color filter layer. The light-emitting layer may include a plurality of light-emitting elements located in the opening area. The color filter layer may include color-resists. Along a first direction, a color-resist may overlap a corresponding light-emitting element. A color-resist may include a first sub-section and a second sub-section, where the first sub-section is located in a corresponding opening area and the second sub-section is located in the non-opening area. The color-resist may include first-type color-resists. In a first-type color-resist, along the first direction, a thickness of the first sub-section may be smaller than a thickness of the second sub-section. The first direction may be the thickness direction of the display panel. By introducing the first-type color-resists into the display panel, when the thickness of the second sub-section in a color-resist of the first-type color-resists located in the non-opening area is designed to be larger and the external light hits the position corresponding to the second sub-section, the second sub-section may absorb the external light, to avoid or reduce the reflection of the light. The second sub-section with a larger thickness may play a better role in reducing reflection, which may be beneficial to improve the contrast of the display panel and the display device. The overall display quality may be improved.

Reference will now be made in detail to exemplary embodiments of the disclosure, which are illustrated in the accompanying drawings. Hereinafter, embodiments consistent with the disclosure will be described with reference to drawings. The disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Figure 2:
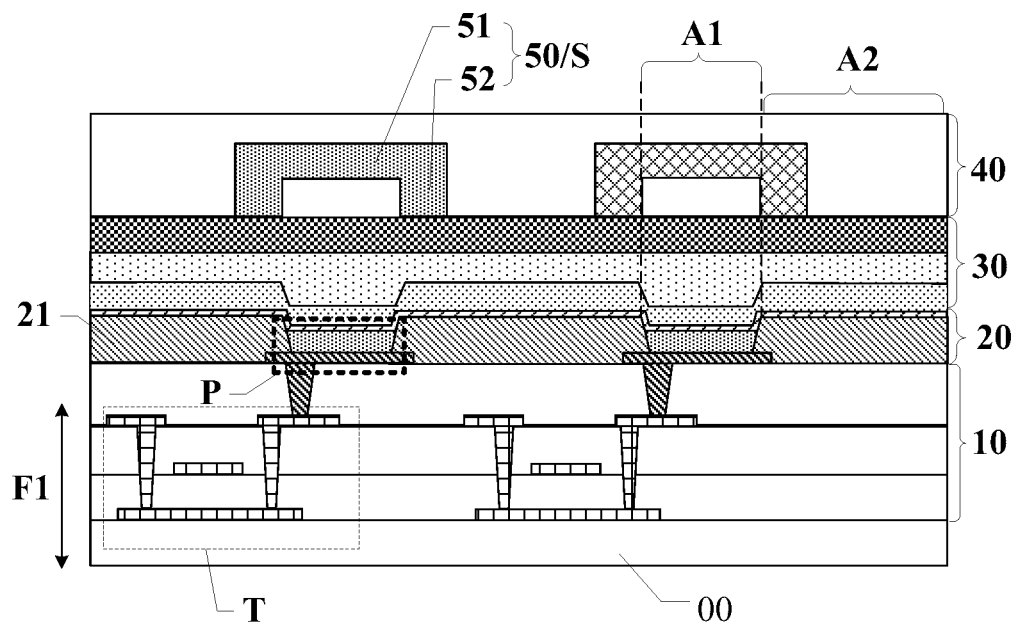
FIG. 2 illustrates a cross-sectional view of the display panel in FIG. 1 along a BB direction, consistent with various disclosed embodiments of the present disclosure.
Figure 3:
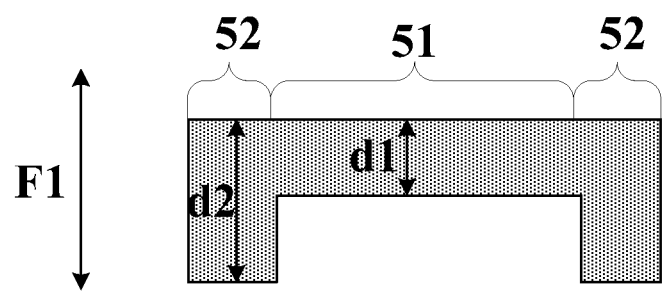
FIG. 3 illustrates an exemplary structure of a first-type color-resist, consistent with various disclosed embodiments of the present disclosure.

FIG. 1 illustrates an exemplary display panel according to one embodiment of the present disclosure, FIG. 2 illustrates a cross-sectional view of the display panel in FIG. 1 along a BB direction, and FIG. 3 illustrates an exemplary structure of a first-type color-resist. As shown in FIG. 1 to FIG. 3, in one embodiment, a display panel 100 may be provided. The display panel 100 may include a display region AA, a substrate 00, a light-emitting layer 20 and a color filter layer 40.

The display region AA may include opening areas A1 and non-opening area A2.

The light-emitting layer 20 and the color filter layer 40 may be disposed at a side of the substrate 00. The light-emitting layer 20 may be located between the substrate 00 and the color filter layer 40. The light-emitting layer 20 may include a plurality of light-emitting elements P located in the opening areas A1. The color filter layer 40 may include color-resists S. Along a first direction F1, a color-resist S may overlap with a corresponding a light-emitting element P of the plurality of light-emitting elements P. A color-resist S may include a first sub-section 51 and a second sub-section 52, where the first sub-section 51 may be located in a corresponding opening area A1 and the second sub-section 52 may be located in the non-opening area A2. The color-resists S may include first-type color-resist 50. In a first-type color-resist 50, along the first direction F1, a thickness d1 of the first sub-section 51 may be smaller than a thickness d2 of the second sub-section 52. The first direction F1 may be a thickness direction of the display panel 100.

Optionally, the display panel provided in this embodiment may be a display panel using an organic light-emitting diode display technology, that is, an organic light-emitting diode (OLED) display panel. A basic structure of the light-emitting layer 20 of the OLED display panel may generally include an anode, a material layer, and a cathode. When a power source supplies a suitable voltage, holes of the anode and electrons of the cathode may combine in the light-emitting material layer, producing bright light. Compared with a thin film field effect transistor liquid crystal display, the OLED display device has the characteristics of high visibility and high brightness, and is more power-saving, light in weight and thin in thickness. Of course, in some other embodiments of the present disclosure, the display panel may also be a display panel using inorganic light-emitting diode display technology, such as a Micro LED display panel, or a Mini LED display panel, and the like. FIG. 2 only uses the OLED display panel as an example to illustrate the present disclosure. Taking the OLED display panel as an example, the light-emitting layer 20 may further include the pixel definition layer 21 for accommodating the light-emitting material layer, and the opening area A1 may be regarded as regions defined by the pixel definition layer 21 for accommodating the light-emitting material layer. The non-opening area A2 may be regarded as other areas in the display region AA except the opening areas A1.

As shown in FIG. 2, in some other embodiments, the display panel may further include a driving layer 10 disposed between the substrate 00 and the light-emitting layer 20. The driving layer 10 may include transistors T electrically connected to the plurality of light-emitting elements P, and a corresponding transistor T may be used for providing an electrical signal to an anode of a corresponding light-emitting element P. Although only the transistors T connected to the anodes of the plurality of light-emitting elements P are shown in the film structure of FIG. 2, optionally, the driving layer 10 may also include other transistors that are not directly connected to the anodes of the plurality of light-emitting elements P. For example, the driving layer 10 may include a plurality of pixel driving circuits, and each of the plurality of pixel driving circuits may include at least two transistors. Optionally, different light-emitting elements P may be connected to different pixel driving circuits. A pixel driving circuit of the plurality of pixel driving circuits may be, for example, a circuit such as 2T1C (including two transistors and one capacitor), 7T1C, or 8T1C in the related art, which is not specifically limited in the present disclosure.

Specifically, in the display panel, the light-emitting layer 20 may include the plurality of light-emitting elements P located in the opening areas A1. The color filter layer 40 may be disposed at a side of the light-emitting layer 20 away from the substrate 00, and may include the color-resists S. Along the first direction F1, a color-resist S may overlap with a corresponding light-emitting element P of the plurality of light-emitting elements P. A color-resist S may include a first sub-section 51 and a second sub-section 52, where the first sub-section 51 may be located in a corresponding opening area A1 and the second sub-section 52 may be located in the non-opening area A2. The color-resists S may include first-type color-resists 50. In the present embodiment, the thickness of the first sub-section 51 and the thickness of the second sub-section 52 in one same first-type color-resist 50 may be designed to be different, such that the thickness d1 of the first sub-section 51 may be smaller than the thickness d2 of the second sub-section 52. When the thickness of the second sub-section 52 located in the non-opening area A2 of the first-type color-resist 50 is designed to be larger and the external light hits the position corresponding to the second sub-section 52, the second sub-section 52 may absorb external light to avoid or reduce the reflection of light. Therefore, the thick second sub-section 52 may play a better role in reducing reflection. When the reflectivity of the display panel 100 is reduced, the contrast may naturally be improved, which is further beneficial to improve the overall display quality of the display panel 100. During display, some of the light emitted by the plurality of light-emitting elements P may be emitted through the first sub-sections 51 in one first-type color-resists 50. When the thickness of the first sub-section 51 located in a corresponding opening area A1 in the first-type color-resist 50 is designed to be smaller, the light loss of the light emitted by the plurality of light-emitting elements when passing through the first sub-sections 51 with the smaller thickness may be smaller, such that the overall display brightness of the display panel is less attenuated to avoid an increase in the power consumption of the display panel.

In one embodiment, when the color filter layer 40 is disposed at a side of the plurality of light-emitting layers 20 away from the substrate 00, optionally, a light-emitting color of a light-emitting element P of the plurality of light-emitting elements P may be same as a color of a corresponding color-resist S overlapping the light-emitting element P. Using the filtering principle of the color-resist S in the color filter layer 40, the color-resist S overlapping with the light-emitting element P may not only play an anti-reflection role, but also may filter the spectrum of the light-emitting element P, such that the spectrum may be narrowed and the color purity may be improved to improve the display effect.

For description purposes only, the display panel in FIG. 1 with a rectangular structure is used as an example to illustrate the present disclosure, and does not limit the scope of the present disclosure. In some other embodiments, the shape of the display panel may be a rounded rectangle, circle, or another irregular shape. Also, FIG. 1 only shows a portion of the plurality of light-emitting elements P in the display region AA, and does not represent actual number of the plurality of light-emitting elements P included in the display panel. FIG. 2 only shows a schematic of a film layer structure of the display panel, and does not represent actual number and thickness of the film layers included in the display panel.

Figure 4:
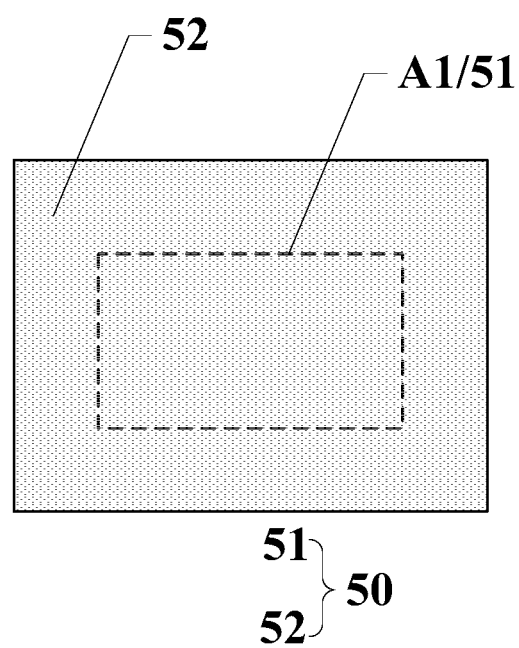
FIG. 4 illustrates a relationship between the relative positions of a first-type color-resist and an opening area, consistent with various disclosed embodiments of the present disclosure.

As shown in FIG. 2 and FIG. 4 which shows a relative position relationship between the first-type color-resists 50 and the opening areas A1, in one embodiment, along the first direction F1, a first sub-section 51 may completely cover a corresponding opening area A1.

The first sub-section 51 may completely cover the corresponding opening area A1 in two manners. In one manner, along the first direction F1, the first sub-section 51 may coincide with the corresponding opening area A1. In another manner, along the first direction F1, a contour edge of the corresponding opening area A1 may be located within an area defined by a contour edge of the first sub-section 51. When the first sub-section 51 completely covers the corresponding opening area A1 along the first direction F1, the thickness of the first-type color-resist 50 at the position corresponding to the corresponding opening area A1 may be uniform, to avoid the abnormal light output of the corresponding light-emitting element P because of the uneven thickness of the first-type color-resist 50 (for example, the light loss is different when passing through because of the uneven thickness of the first-type color-resist 50, which eventually leads to uneven light-emitting brightness). Therefore, the light-emitting uniformity of the corresponding light-emitting element P may be improved.

In the present embodiment, a first-type color-resist 50 in the color filter layer 40 may be a color-resist where the thickness of the first sub-section 51 and the thickness of the second sub-section 52 in the first-type color-resist 50 is designed to be different such that the thickness d1 of the first sub-section 51 may be smaller than the thickness d2 of the second sub-section 52. Optionally, the color filter layer 40 may further include other color-resists besides the first-type color-resists 50. For example, the other color-resists may be second-type color-resists, and the second-type color-resists may be color-resists without the characteristics of the first-type color-resists 50. In one embodiment, optionally, a second-type color-resist may be a color-resist with an even thickness or a color-resist where a thickness of a portion of the second-type blocker overlapping a corresponding opening area is larger than a thickness of another portion overlapping the non-opening area.

Figure 5:
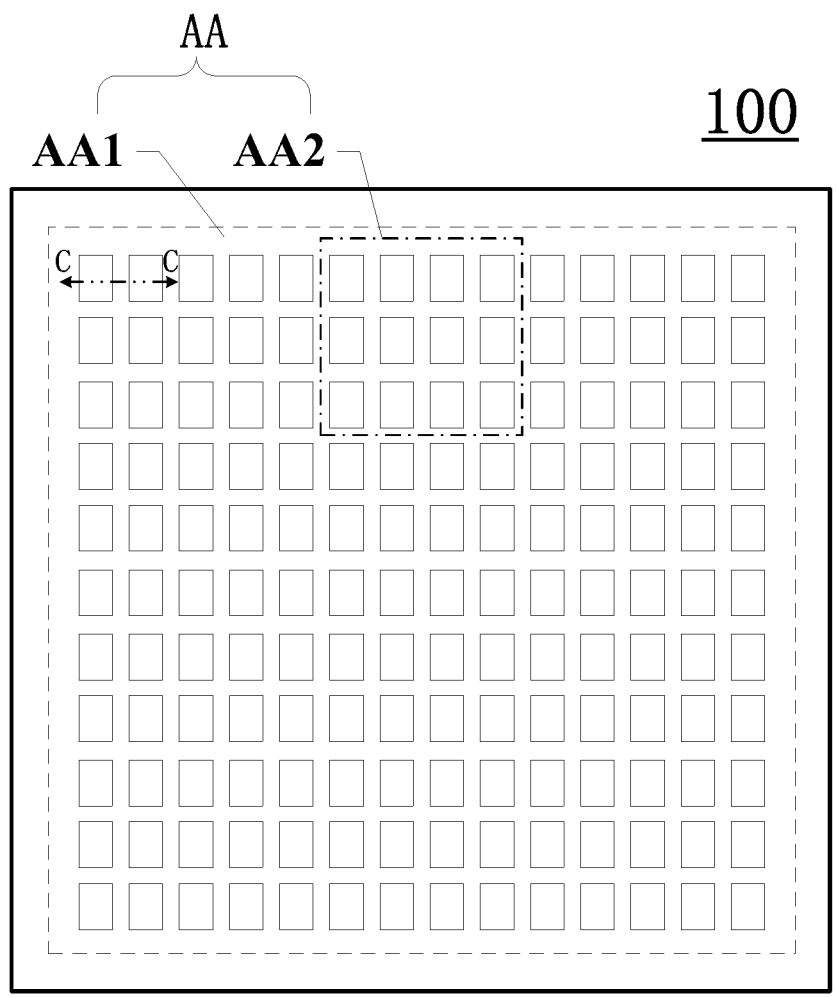
FIG. 5 illustrates another exemplary structure of a display panel consistent with various disclosed embodiments of the present disclosure.

As shown in FIG. 5 which is another schematic structure of the display panel, in one embodiment, the display region AA may include a first display region AA1 and an optical component region AA2. The first-type color-resists 50 may be located in the optical component region AA2.

As shown in FIG. 2 and FIG. 5, optionally, the optical component region AA2 may be used to accommodate electronic photosensitive devices including cameras, infrared sensing devices, or fingerprint identification devices. When the optical component region AA2 is arranged in the display region AA, the optical component region AA2 may not need to occupy the space of the non-display region, which is beneficial to increase the screen ratio of the display panel. For example, in one embodiment, the optical component region AA2 may be provided with a camera. Therefore, during normal display, the optical component region AA2 may be able to play a display role; and when it is necessary to take pictures or videos, the camera may take photos or videos through the optical component region AA2. Correspondingly, the optical components area AA2 may simultaneously realize the function of display and photographing.

In existing technologies, to ensure the light transmittance effect of the optical component region AA2, it is necessary to improve the light transmittance of the optical component region AA2. However, when the transmittance of the optical component region AA2 increases, it brings the risk of increased reflectivity, such that the reflectivity of the optical component region is higher than that of the conventional display region, resulting in uneven display of the entire display panel. To solve this problem, in the present embodiment, the first-type color-resists 50 may be disposed in the optical component region AA2. In one first-type color-resist 50, the thickness of the second sub-section 52 located in the non-opening area A2 may be larger than the thickness of the first sub-section 51 located in a corresponding opening area A1, and the thicker second sub-section 52 may absorb the external light such that the second sub-section 52 may play a better role in reducing the reflection of the optical component region AA2 and effectively alleviate the problem of high reflection of the optical component region AA2. Therefore, the reflectivity difference between the optical component region AA2 and the first display region AA1 may be balanced, such that the reflectivity of the optical component region AA2 and the reflectivity of the first display region AA1 may tend to be consistent. Correspondingly, the display uniformity of the optical component region AA2 and the first display region AA1 may be improved, to improve the overall display quality of the display panel.

The embodiment in FIG. 5 where the display panel 100 includes one optical component region AA2 is used as an example to illustrate the present disclosure, and does not limit the scope of the present disclosure. In some other embodiments, two or more optical component regions AA2 may be provided in the display panel 100 according to requirements, and the present disclosure has no limit on this. Also, FIG. 5 where the first display region AA1 semi-surrounds the optical component region AA2 is used as an example to illustrate the present disclosure, and does not limit the scope of the present disclosure. In some other embodiments, the first display region AA1 may completely surround the optical component region AA2. Also, FIG. 5 showing a relative position relationship of the first display region AA1 and the optical component region AA2 in the display panel 100 is used as an example to illustrate the present disclosure, and does not limit the scope of the present disclosure. In some other embodiments, the optical component region AA2 may be disposed at other suitable position in the display panel 100, and the present disclosure has no limit on this. Also, FIG. 5 where the shape of the optical component region AA2 is a rectangle is used as an example to illustrate the present disclosure, and does not limit the scope of the present disclosure. In some other embodiments, the shape of the optical component region AA2 may be a circle, an ellipse, or another suitable shapes, and the size of the optical component region AA2 may be configured according to actual needs. The present disclosure has no limit on this.

Figure 6:
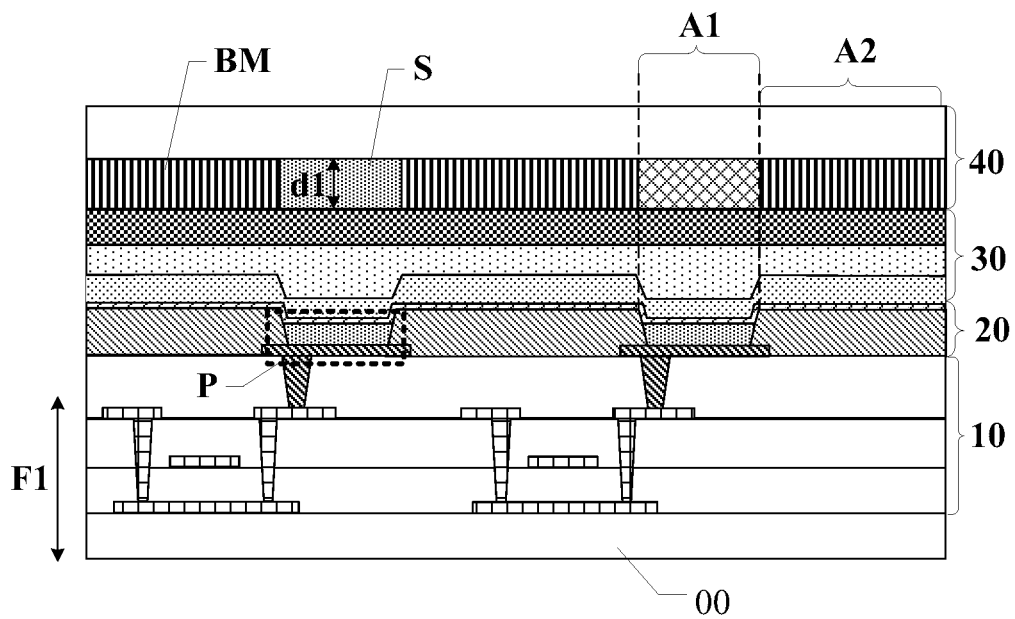
FIG. 6 illustrates a cross-sectional view of the display panel in FIG. 5 along a CC direction, consistent with various disclosed embodiments of the present disclosure.

FIG. 6 illustrates a cross-sectional view of the display panel along the CC direction in FIG. 5, which specifically is a cross-sectional view of a partial region of the first display region AA1 in the display panel 100. Optionally, FIG. 2 may be considered as a cross-sectional view of the optical component region AA2 along the BB direction. In one embodiment, the first display region AA1 and the optical component region AA2 may both include at least two types of light-emitting elements P with different emitting colors, and correspondingly, both the first display region AA1 and the optical component region AA2 may include at least two types of color-resists S with different colors. Optionally, the light-emitting elements P included in the first display region AA1 and the optical component region AA2 may be, for example, light-emitting elements P that emit red, green or blue light respectively, and the first-type color-resists 50 may be red, green or blue color-resists correspondingly.

As shown in FIG. 2, FIG. 5, and FIG. 6, in one embodiment, among the color-resists with a same color, along the first direction F1, the thickness of the first sub-sections 51 of the color-resists S in the optical component region AA2 may be same as the thickness of the color-resists S overlapping the light-emitting elements P in the first display region AA1.

In the present embodiment, the color filter layer 40 may be introduced on the side of the light-emitting layer 20 away from the substrate 00, and the color-resists S may overlap with the light-emitting elements P along the first direction F1. That is, the light emitted by the light-emitting elements P may need to pass through the color-resists S before it is emitted toward the light-emitting surface of the display panel. Optionally, the colors of the color-resists S located directly above the light-emitting elements P of the same color may be same. The thickness of the color-resists S above the light-emitting elements P may be different, and the light output of the light-emitting elements P may be different correspondingly. When the color-resists S are introduced into the optical component region AA2, the thicknesses of the first sub-section 51 and the second sub-section 52 of one color-resist S may be differently designed, and the thickness of the first sub-section 51 located directly above the corresponding light-emitting element P may be ensured to be same as the thickness of the color-resists S with the same color in the first display region AA1 (a portion that overlapping the light-emitting elements P) at the same time, such that the thickness of the color-resists S directly above the light-emitting elements P of the same light-emitting color in the first display region AA1 and the optical component region AA2 may all be the same, and the light output through the color-resists S may be also the same. Therefore, the display brightness difference of the light-emitting elements P of the same light-emitting color in the first display region AA1 and the optical component region AA2 may be reduced, to improve the overall display uniformity of the display panel.

Figure 7:
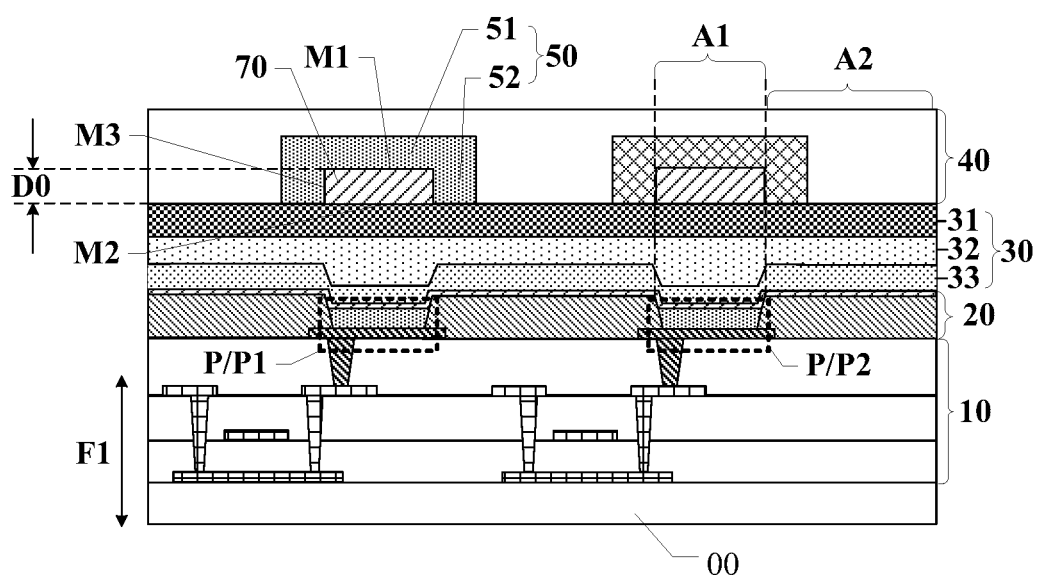
FIG. 7 illustrates another cross-sectional view of the display panel in FIG. 1 along a BB direction, consistent with various disclosed embodiments of the present disclosure.

FIG. 7 shows another cross-sectional view of the display panel along the BB direction in FIG. 1. As shown in FIG. 7, in one embodiment, the display panel may further include interlayer components 70. One interlayer component 70 may be located between a corresponding first-type color-resist 50 and a corresponding light-emitting layer 20, and may overlap a corresponding first sub-section 51.

Specifically, in the present embodiment, one interlayer component 70 may be disposed between the corresponding first-type color-resist 50 and the corresponding light-emitting layer 20. More specifically, one interlayer component 70 may be disposed between the corresponding light-emitting element P and the corresponding first-type color-resist 50. When the first-type color-resist 50 is fabricated on a side of the interlayer component 70 away from the substrate 00, the first-type color-resist 50 may be formed into two sub-sections with different thicknesses. Optionally, the interlayer component 70 may be located directly above the corresponding light-emitting element P, such that the first sub-section 51 with a smaller thickness may be formed directly above the light-emitting element P, and the second sub-section 52 with a larger thickness may be formed at the position where the interlayer component 70 is not provided. The second sub-section 52 with a larger thickness may be used to effectively reduce the reflectivity of the corresponding area, thereby helping to improve the contrast ratio of the display panel and improve the overall display quality of the display panel.

As shown in FIG. 7, in one optional embodiment, one interlayer component 70 may include a first surface M1 and a second surface M2 oppositely disposed along the first direction F1, and a side surface M3 disposed on a side of the first surface M1 and the second surface. The first surface M1 may be located on a side of the second surface M2 away from the corresponding light-emitting element P, and the corresponding first-type color-resist 50 may cover the first surface M1 and the side surface M3 of the interlayer component 70.

Specifically, in the display panel provided by the present embodiment, one interlayer component 70 may be disposed between the corresponding first-type color-resist 50 and the corresponding light-emitting layer 20. In the actual manufacturing process, the interlayer component 70 may be fabricated first, and then the corresponding first-type color-resist 50 may be deposited on a side of the interlayer component 70 away from the substrate 00. Because of the fluidity of blockers, the first-type color-resist 50 may first flow to the position where the interlayer component 70 is not provided (for example, the side of the interlayer component 70), and finally the first sub-section 51 and the second sub-section 52 with different thicknesses may be formed directly above and on the side of the interlayer component 70, to cover the first surface M1 and each side surface M3 of the interlayer component 70. That is, the corresponding first-type color-resist 50 may wrap the interlayer component 70, to ensure that the corresponding second sub-section 52 with a larger thickness is formed surround the interlayer component 70. That is to say, each side surface of the interlayer portion may be provided with a second sub-section 52 capable of reducing the reflection, so it is beneficial to improve the effect of reducing reflection to a certain extent. Optionally, the surfaces of the first sub-section 51 and the second sub-section 52 on the side away from the substrate may be flush. Optionally, the first-type color-resist 50 and the interlayer component 70 may be disposed in the optical component region AA2, which may be beneficial to effectively reduce the reflectivity of the optical component region AA2, such that the reflectivity of the optical component region AA2 and the reflectivity of the first display region AA1 may be consistent and the display effect of the optical component region AA2 may be improved.

Optionally, in one embodiment, the interlayer component 70 may completely cover the corresponding opening area A1, and the thickness of the interlayer component 70 corresponding to the same opening area A1 may be uniform. Correspondingly, when the light emitted by the same light-emitting element P passes through the interlayer component 70 with the same thickness and the first sub-section 51 with the same thickness, the light loss or light extraction rate may be consistent, which may be beneficial to improve the overall display brightness uniformity of the display panel.

The film layer structure of at least a part of the first display region AA1 can be referred to FIG. 6. In this area, the color filter layer 40 may further include a black matrix BM besides the first-type color-resists 50. The black matrix BM may include a plurality of openings and one color-resist S may be filled in a corresponding opening. In this partial area, the area blocked by the black matrix BM may be regarded as the non-opening area A2, and the area not blocked by the black matrix BM may be regarded as the opening area A1. In the opening area A1, the first-type color-resist 50 may overlap with the corresponding light-emitting element P, and the first-type color-resist 50 and the corresponding light-emitting element P may be both located in the opening area A1. Since the black matrix BM is arranged in the non-opening area A2, the black matrix BM may have a better effect of absorbing light. Correspondingly, this design method may also effectively reduce the reflectivity of the first display region AA1, improve the contrast ratio, and further improve the display quality. When the part of the first display region AA1 adopts the film layer structure as shown in FIG. 6, since the black matrix BM is provided in the non-opening area A2, a part of the light with a large viewing angle emitted by the light-emitting element P may be absorbed by the black matrix BM, and its large viewing angle may be less bright. When the optical component region AA2 adopts the film layer structure shown in FIG. 2, the black matrix BM may be removed from the film layer structure, such that the transmittance of the optical component region AA2 may be greatly improved, which is beneficial to improve the photosensitive effect of the component region AA2 in the photosensitive stage. Therefore, the transmittance of the optical component region AA2 may be larger than the transmittance of the first display region AA1. Since the non-opening area A2 of the optical component region AA2 is not blocked by the black matrix, the embodiments of the present disclosure may increase the thickness of the second sub-section 52 of the first-type color-resist 50 located in the non-opening area A2 in the optical component region AA2.

Correspondingly, the thickness of the second sub-section 52 may be increased, and it may be beneficial to reduce the reflectivity. Also, it may block some large-angle light rays emitted by the light-emitting element P to a certain extent, thereby helping to reduce the relative brightness difference of the first display region AA1 and the optical component region AA2 at a large viewing angle. Then, the display brightness uniformity of the first display region AA1 and the optical component region AA2 may be improved, thereby improving the overall display effect of the display panel.

As shown in FIG. 7, in one embodiment, the transmittance of the interlayer component 70 may be larger than the transmittance of the corresponding first sub-section 51.

Specifically, when the interlayer component 70 is introduced between the corresponding first sub-section 51 and the corresponding light-emitting element P, the light emitted by the light-emitting element P may pass through the interlayer component 70 and then exit through the corresponding first-type color-resist 50. In this embodiment, the transmittance of the interlayer component 70 may be configured to be larger than the transmittance of the corresponding first sub-section 51. Correspondingly, the light loss caused when the light is transmitted from the interlayer component 70 to the corresponding first sub-portion 51 may be reduced, and the light withdrawal rate of the light-emitting element P can be improved as much as possible.

Optionally, the interlayer component 70 and the corresponding first-type color-resist 50 may be made of different materials.

In one optional embodiment, the transmittance of the interlayer component 70 may be larger than 95%. When the transmittance of the interlayer component 70 is set to be larger than 95% and the light emitted by the corresponding light-emitting element P passes through the interlayer component 70, most of the light may be emitted from the interlayer component 70 and directed to the corresponding first-type color-resist 50. When the transmittance of the interlayer component 70 is larger, the light loss of the light emitted by the corresponding light-emitting element P may be smaller. Correspondingly, the light extraction rate of the display panel and the overall display brightness may be improved.

As shown in FIG. 7, in one optional embodiment, along the first direction F1, the thickness of the interlayer component 70 may be D0 with $0.5\ \mu m \leq D0 \leq 2\ \mu m$.

When the interlayer component 70 is introduced between the corresponding light-emitting element P and the corresponding first sub-section 51, since the corresponding first sub-section 51 is located directly above the interlayer component 70 and the corresponding second sub-section 52 is located around the corresponding first sub-section 51, the thickness of the interlayer component 70 may have a direct impact on the thickness of the corresponding first sub-section 51 and the corresponding second sub-section 52. When the thickness of the interlayer component 70 is less than 0.5 μm, the thickness of the corresponding second sub-portion 52 in the non-opening area A2 of the corresponding first-type color-resist 50 may be reduced, which may affect the anti-reflection effect of the corresponding second sub-section 52. When the thickness of the interlayer component 70 may be larger than 2 μm, the larger the thickness of the interlayer component 70 is, the larger the light loss of the corresponding light-emitting element P after passing through the interlayer component 70, and the larger the influence on the light-emitting rate of the corresponding light-emitting element P from the front viewing angle. Correspondingly, the second sub-section 52 in the non-opening area A2 may be too thick, which may cause a high process risk. Therefore, in the present disclosure, the thickness of the interlayer component 70 may be set between 0.5 μm and 2 μm, which may not only ensure the light output rate of the corresponding light-emitting element P at the front view angle, but also ensure that the thickness of the corresponding second sub-section 52 may achieve better anti-reflection effect. At the same time, it may also avoid the problem of high risk in the process due to the excessive thickness of the corresponding second sub-section 52.

Optionally, $0.6\ \mu m \leq D0 \leq 1.8\ \mu m$, or $0.8\ \mu m \leq D0 \leq 1.5\ \mu m$, or $1\ \mu m \leq D0 \leq 1.6\ \mu m$.

As shown in FIG. 7, in one first-type color-resist 50, along the first direction F1, the sum of the thicknesses of the corresponding first sub-section 51 and the corresponding interlayer component 70 may be equal to the thickness of the corresponding second sub-section 52. That is, the difference between the thickness of the corresponding second sub-section 52 and the thickness of the corresponding first sub-section 51 may be exactly the thickness of the corresponding interlayer component 70. Correspondingly, the thickness of the corresponding second sub-section 52 may be adjusted by controlling the thickness of the corresponding interlayer component 70. When it is necessary to improve the anti-reflection effect of the corresponding second sub-section 52 and the absorption effect of light with a large viewing angle, the thickness of the corresponding second sub-section 52 may be increased by increasing the thickness of the corresponding interlayer component 70. When it is necessary to slightly decrease the absorption effect of the corresponding second sub-section 52 on the light with a large viewing angle, the thickness of the corresponding second sub-section 52 may be reduced by reducing the thickness of the corresponding interlayer component 70. Therefore, by setting the sum of the thicknesses of the corresponding first sub-section 51 and the corresponding interlayer component 70 to be equal to the thickness of the corresponding second sub-section 52, the anti-reflection effect of the corresponding second sub-section 52 and the absorption effect of light with a large viewing angle may be adjusted by flexibly setting the thickness of the corresponding interlayer component 70. Correspondingly, the application flexibility of the interlayer component 70 and the first-type color-resist 50 may be improved.

As shown in FIG. 2 and FIG. 7, the display panel may further include an encapsulation layer 30 located between the color filter layer 40 and the light-emitting layer 20. The interlayer components 70 may be located between the encapsulation layer 30 and the first sub-sections 51. The encapsulation layer 30 may include a first encapsulation layer 31 adjacent to the first-type light blockers 50. A difference between the refractive indices of the first encapsulation layer 31 and the interlayer component 70 may be Δn0, where $|\Delta n0| < 0.15$.

Optionally, in the present embodiment, the encapsulation layer 30 may be disposed between the color filter layer 40 and the light-emitting layer 20, to seal the light-emitting layer 20 and prevent invasion of external moisture, oxygen, etc., into the light-emitting layer 20 from affecting the normal light emission of the light-emitting elements P. Optionally, the embodiment shown in FIG. 7 where the encapsulation layer 30 includes the first encapsulation layer 31, a second encapsulation layer 32 and a third encapsulation layer 33 is used as an example for illustration. The first encapsulation layer 31 may be adjacent to the color filter layer 40, the third encapsulation layer 33 may be adjacent to the light-emitting layer 20, and the second encapsulation layer 32 may be located between the first encapsulation layer 31 and the second encapsulation layer 32. Optionally, the first encapsulation layer 31 may be an inorganic layer, the second encapsulation layer 32 may be an organic layer, and the third encapsulation layer 33 may be an inorganic layer. By using a combination of inorganic layers and organic layers to encapsulate the light-emitting layer 20, the encapsulation effect may be improved, and also the phenomenon of unreliable encapsulation caused by the use of a large-area inorganic layer may be avoided. Therefore, the encapsulation reliability may be improved. It should be noted that FIG. 7 is used as an example for illustration purpose only, and does not limit the actual structure of the encapsulation layer 30. In some other embodiments, various feasible encapsulation structures may also be used to encapsulate the light-emitting layer 20. For example, only one encapsulation layer 30 may be introduced between the light-emitting layer 20 and the color filter layers 40, as long as the encapsulation layer 30 has a better encapsulation effect on the light-emitting layer 20. For example, as shown in FIG. 8 which shows another cross-sectional view of the display panel in FIG. 1 along the BB direction, when the encapsulation layer 30 includes only one layer, the encapsulation layer 30 may be the first encapsulation layer 31.

Figure 8:
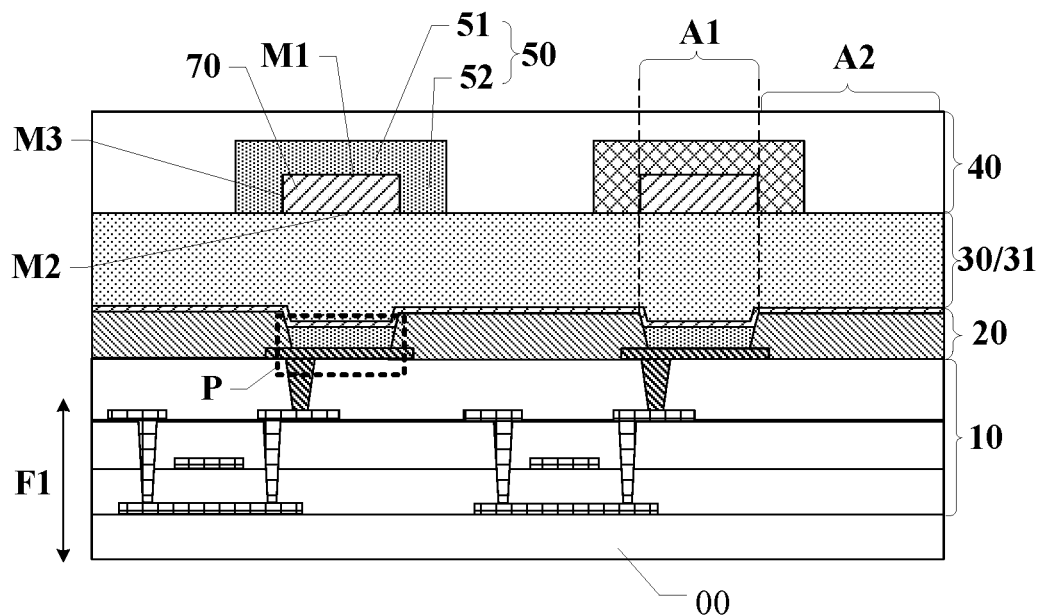
FIG. 8 illustrates another cross-sectional view of the display panel in FIG. 1 along a BB direction, consistent with various disclosed embodiments of the present disclosure.

As shown in FIG. 7 and FIG. 8, in one embodiment, the encapsulation layer 30 may include the first encapsulation layer 31 adjacent to the first-type color-resists 50. When the interlayer components 70 are introduced, one interlayer component 70 may be located between the first encapsulation layer 31 and a corresponding first sub-section 51, and the refractive index difference between the first encapsulation layer 31 and the interlayer component 70 may be set to be small, for example, less than 0.15. Correspondingly, when the light passes through the first encapsulation layer 31 to the interlayer component 70, the optical path of the light may not be shifted or the amount of shift will be reduced. The light extraction rate of the display panel may be ensured. Optionally, the refractive indices of the first encapsulation layer 31 and the interlayer component 70 may be set to be same.

As shown in FIG. 7 and FIG. 8, in one embodiment, the display panel may further include an encapsulation layer 30 located between the color filter layer 40 and the light-emitting layer 20. The interlayer components 70 may be located between the encapsulation layer 30 and the first sub-sections 51. The encapsulation layer 30 may include a first encapsulation layer 31 adjacent to the first-type light blockers 50. One light-emitting element P may include a first-color light-emitting element P1 and a second-color light-emitting element P2, and the light-emitting colors of the first-color light-emitting element P1 and the second-color light-emitting element P2 may be different. The refractive index different between a portion of the corresponding interlayer component 70 intersecting with the first-color light-emitting element P1 along the first direction F1 may be $\Delta n1$, and the refractive index different between another portion of the corresponding interlayer component 70 intersecting with the second-color light-emitting element P2 along the first direction F1 may be $\Delta n2$, where $|\Delta n1|<|\Delta n2|$.

In the display panel provided by various embodiments of the present disclosure, the encapsulation layer 30 may be a three-layer structure as shown in FIG. 7, or a single-layer structure as shown in FIG. 8, which is not specifically limited in the present disclosure. The difference between the refractive indices of the interlayer components 70 and the first encapsulation layer 31 may directly affect the light extraction efficiency of the light-emitting elements P. When the difference between the refractive indices of one interlayer component 70 and the first encapsulation layer 31 is large, the light extraction efficiency of the corresponding light-emitting element P may decrease. On the contrary, when the difference between the refractive indices of the interlayer component 70 and the first encapsulation layer 31 is small, the light extraction efficiency of the corresponding light-emitting element P may be larger. In the present embodiment, one light-emitting element P may include the first-color light-emitting element P1 and the second-color light-emitting element P2 with different light-emitting colors. Optionally, the light-emitting efficiency of the first-color light-emitting element P1 may be lower than the light-emitting efficiency of the second-color light-emitting element P2. In this embodiment, the difference $|\Delta n1|$ between the refractive indices of the interlayer component 70 corresponding to the first-color light-emitting element P1 and the first encapsulation layer 31 may be set to be smaller than the difference $|\Delta n2|$ between the refractive indices of the interlayer component 70 corresponding to the second-color light-emitting element P2 and the first encapsulation layer 31. The difference between the refractive indices of the interlayer components 70 and the first encapsulation layer 31 may be used to balance the light extraction efficiencies of the first-color light-emitting element P1 and the second-color light-emitting element P2. Therefore, the difference in light-emitting efficiency between the light-emitting elements P of different colors in the display panel may be improved, which may be further beneficial to improve the overall display brightness uniformity of the display panel.

Figure 9:
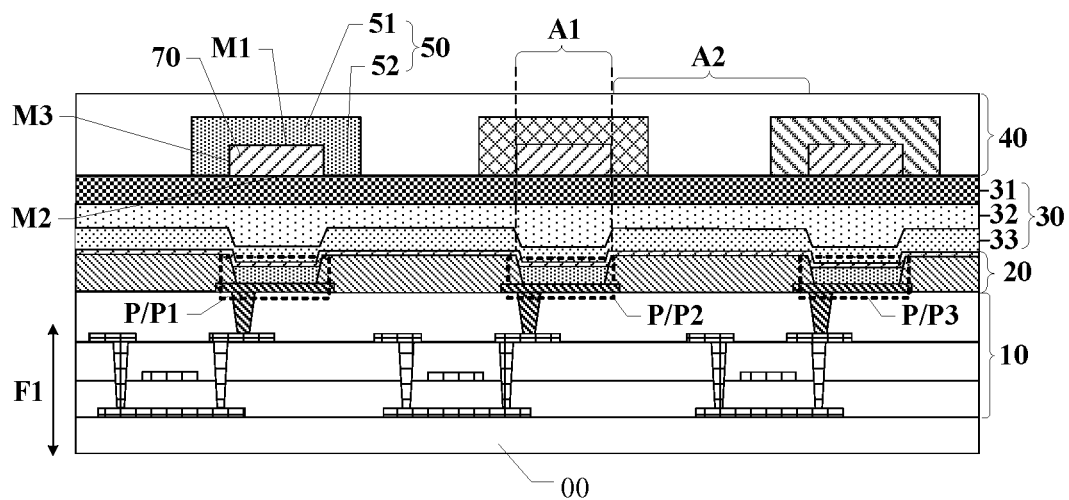
FIG. 9 illustrates another cross-sectional view of the display panel in FIG. 1 along a BB direction, consistent with various disclosed embodiments of the present disclosure.

For description purposes only, the embodiment shown in FIG. 7 where the display panel includes the light-emitting elements P with two different colors, is used as an example to illustrate the present disclosure. In some other embodiments, the display panel may include the light-emitting elements P with three different colors. In one embodiment shown in FIG. 9 which is another cross-sectional view of the display panel in FIG. 1 along the BB direction, the display panel may include first-color light-emitting elements P1, second-color light-emitting elements P2, and third-color light-emitting elements P3, and the difference between the refractive indices of the interlayer component 70 corresponding to the third-color light-emitting element P3 and the first encapsulation layer 31 may be $\Delta n3$. When the light-emitting efficiency of the third-color light-emitting elements P3 is the same as the light-emitting efficiency of the first-color light-emitting elements P1, $|\Delta n3|=|\Delta n1|$. When the light-emitting efficiency of the third-color light-emitting elements P3 is the same as the light-emitting efficiency of the second-color light-emitting elements P2 is the same, $|\Delta n3|=|\Delta n2|$. When the light-emitting efficiency of the third-color light-emitting elements P3 is less than the light-emitting efficiency of the first-color light-emitting elements P1, $|\Delta n3|<|\Delta n1|$. When the light-emitting efficiency of the third-color light-emitting elements P3 is between the light-emitting efficiency of the first-color light-emitting elements P1 and the light-emitting efficiency of the second-color light-emitting elements P2, $|\Delta n1|<|\Delta n3|<|\Delta n2|$. When the light-emitting efficiency of the light-emitting elements P3 is greater than the light-emitting efficiency of the second-color light-emitting elements P2, $|\Delta n3|>|\Delta n2|$.

Optionally, the first-color, the second-color, and the third-color in the present disclosure may be red, green, and blue respectively.

In one embodiment, the interlayer components 70 may be made of a material including nitride or oxynitride, such as $SiN_x$ or $SiO_xN_y$. Specifically, nitride or oxynitride has high transmittance, and the refractive index of the nitride or oxynitride is similar to the refractive index of the first encapsulation layer 31. When the nitride or oxynitride is used to form the interlayer components 70, the first sub-sections 51 and the second sub-sections 52 with different thicknesses may be formed easily and the second sub-sections 52 with a larger thickness may be used to realize the anti-reflection effect, and it may be also beneficial to ensure the light extraction rate of the corresponding light-emitting element P.

Figure 10:
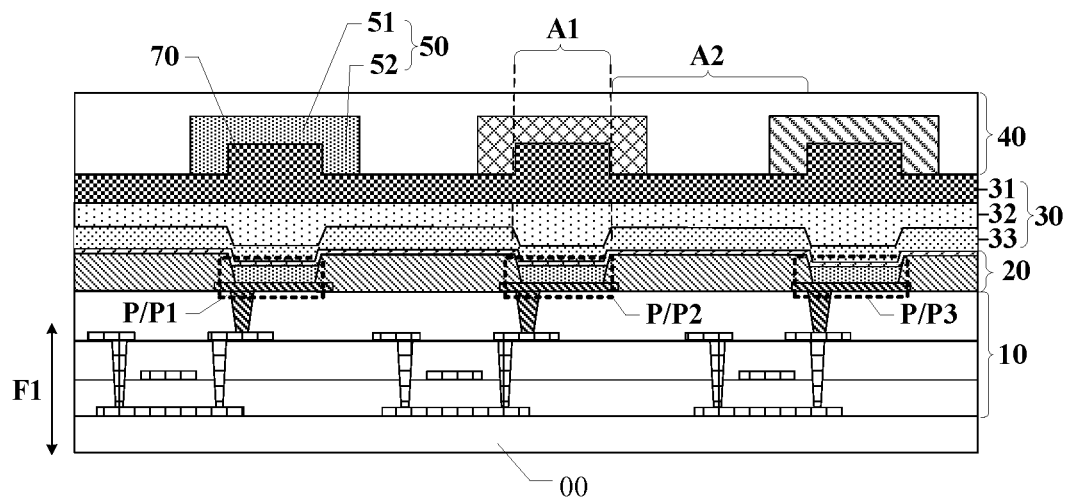
FIG. 10 illustrates another cross-sectional view of the display panel in FIG. 1 along a BB direction, consistent with various disclosed embodiments of the present disclosure.

As shown in FIG. 10 which is another cross-sectional view of the display panel in FIG. 1 along the BB direction, the display panel may further include an encapsulation layer 30 located between the color filter layer 40 and the light-emitting layer 20. The interlayer components 70 may be located between the encapsulation layer 30 and the first sub-sections 51. The encapsulation layer 30 may include a first encapsulation layer 31 adjacent to the first-type light blockers 50. The interlayer components 70 may be made of a material same as the first encapsulation layer 31.

In the display panel provided by various embodiments of the present disclosure, the encapsulation layer 30 may be a three-layer structure as shown in FIG. 10, or a single-layer structure as shown in FIG. 8, which is not specifically limited in the present disclosure. In one embodiment, the interlayer components 70 may be made of a material same as the first encapsulation layer 31. Correspondingly, the refractive index of the first encapsulation layer 31 and the refractive indices of the interlayer components 70 may also be the same. Correspondingly, when the light emitted by the light-emitting elements P is emitted to the interlayer components 70 through the first encapsulation layer 31, the optical path of the light may be prevented from shifting, thereby ensuring the light extraction rate of the light-emitting elements P.

Further, when the interlayer components 70 are made of a material same as the first encapsulation layer 31, the material composition in the display panel may also be simplified, such that the production process of the display panel may be simplified to a certain extent.

As shown in FIG. 10, in one embodiment, the interlayer components 70 and the first encapsulation layer 31 may be integrally formed. That is, the interlayer components 70 and the first encapsulation layer 31 may be fabricated simultaneously in the same process, and there may be no need to introduce different manufacturing processes for the interlayer components 70 and the first encapsulation layer 31 respectively. The overall manufacturing process of the display panel may be simplified, and the production efficiency may be improved.

Figure 11:
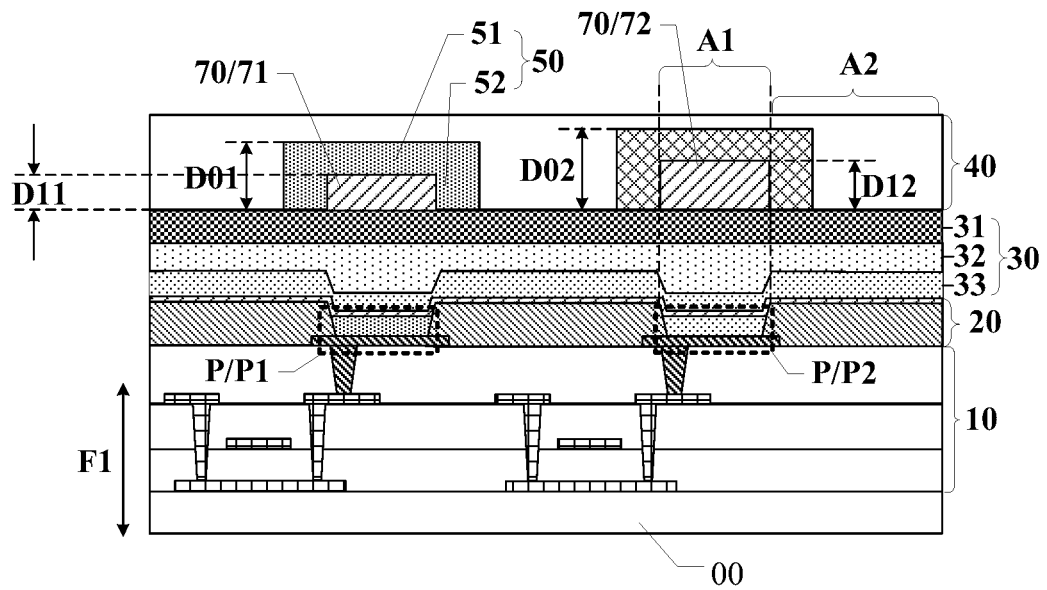
FIG. 11 illustrates another cross-sectional view of the display panel in FIG. 1 along a BB direction, consistent with various disclosed embodiments of the present disclosure.

As shown in FIG. 11 which is another cross-sectional view of the display panel in FIG. 1 along the BB direction, in one embodiment, one light-emitting element P may include a first-color light-emitting element P1 and a second-color light-emitting element P2. The first-color light-emitting element P1 and he second-color light-emitting element P2 may have different light-emitting colors.

One interlayer component 70 may include a first interlayer component 71 overlapping a corresponding first-color light-emitting element P1 along the first direction F1, and a second interlayer component 72 overlapping a corresponding second-color light-emitting element P2 along the first direction F1. Along the first direction F1, a thickness D11 of the first interlayer component 71 may be smaller than a thickness D12 of the second interlayer component 72.

Specifically, the embodiment of FIG. 11 shows a scheme in which the thicknesses of the interlayer components 70 corresponding to the two light-emitting elements P with different light-emitting colors are different. Optionally, the light-emitting elements P of the same color may have the maximum light-emitting brightness under the front viewing angle, and the light-emitting brightness under the large viewing angle may be smaller than its light-emitting brightness under the front-view viewing angle. When the light-emitting brightness at the front viewing angle and the light-emitting brightness at the first large viewing angle of the light-emitting elements P of the same color are quite different, the light-emitting attenuation of the light-emitting elements P at the large viewing angle may be relatively serious. In this embodiment, the display panel may include the first-color light-emitting elements P1 and the second-color light-emitting elements P2 with different light-emitting colors. Optionally, the brightness difference of one first-color light-emitting element P1 at the first large viewing angle and the front viewing angle may be S1, and the brightness difference of the second-color light-emitting element P2 at the first large viewing angle and the front viewing angle may be S2, where S1>S2. That is, the brightness attenuation of the first-color light-emitting element P1 under the first large viewing angle may be larger than the brightness attenuation of the second-color light-emitting element P2 at the first large viewing angle.

In the present embodiment, the interlayer component 70 may be located between the corresponding first-type color-resist 50 and the corresponding light-emitting element P. The thickness of the interlayer component 70 may be proportional to the thickness of the second sub-section 52 in the corresponding first-type color-resist 50. When the thickness of the interlayer component 70 is larger, the thickness of the corresponding second sub-section 52 may be larger. In the present embodiment, the second sub-section 52 in the first-type color-resist 50 may be equivalent to being located in the direction of the large viewing angle corresponding to the corresponding light-emitting element P. When the thickness of the second sub-section 52 is larger, more light of the corresponding light-emitting element P under the large viewing angle may be blocked or absorbed. On the contrary, when the thickness of the second sub-section 52 is smaller, less light of the corresponding light-emitting element P under the large viewing angle may be blocked or absorbed. In the embodiments of the present disclosure, the thickness of the first interlayer component 71 corresponding to the first-color light-emitting element P1 with serious light-emitting attenuation under the first large viewing angle may be set to be smaller. Therefore, the thickness of the corresponding second sub-section 52 may also be smaller. The thickness of the second interlayer component 72 corresponding to the second-color light-emitting element P2 with relatively small light-emitting attenuation under the first large viewing angle may be set to be larger, and then the thickness of the corresponding second sub-section 52 may also be larger. Correspondingly, the brightness difference of the light-emitting elements P of different colors under the same first large viewing angle may be balanced, thereby reducing or avoiding the possibility of color shift of the display panel under the large viewing angle to improve the display effect under the large viewing angle.

Figure 12:
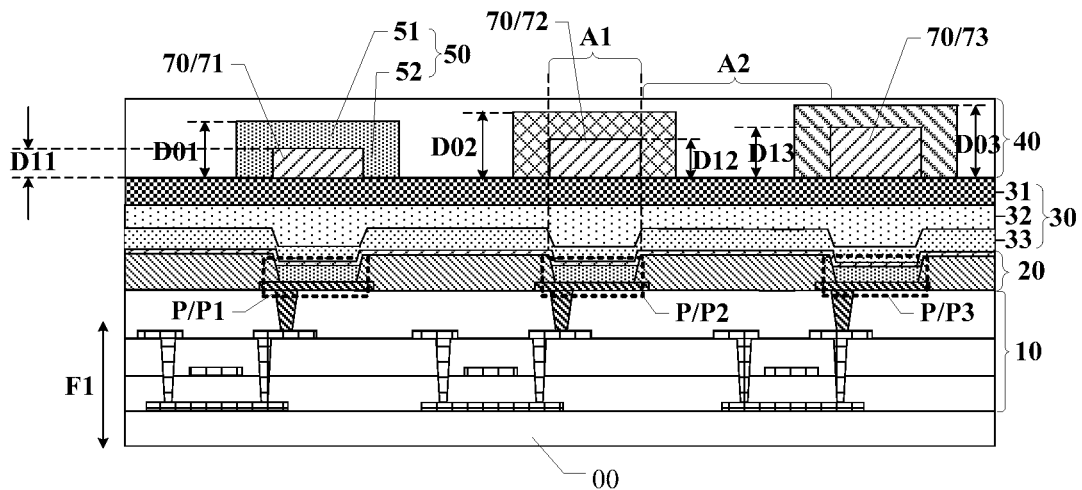
FIG. 12 illustrates another cross-sectional view of the display panel in FIG. 1 along a BB direction, consistent with various disclosed embodiments of the present disclosure.

FIG. 12 is another cross-sectional view of the display panel in FIG. 1 along the BB direction. In the present embodiment, the display panel may include first-color light-emitting elements P1, second-color light-emitting elements P2, and third-color light-emitting elements P3.

In one embodiment, one light-emitting element P in the display panel may further include a third light-emitting element P3. The light-emitting color of the third light-emitting element P3, the light-emitting color of the first light-emitting element P1, and the light-emitting color of the second light-emitting element P2 may be different from each other. One interlayer component 70 may further include a third interlayer component 73 overlapping with a corresponding third-color light-emitting element P3 along the first direction F1. Along the first direction, the thickness D13 of the third interlayer component 73 may be larger than the thickness D12 of the second interlayer component 72.

Optionally, when the third-color light-emitting elements P3 having the light-emitting color different from the first-color light-emitting elements P1 and the second-color light-emitting elements P2 are introduced into the display panel, the brightness difference of the first-color light-emitting element P1 under the first large viewing angle and the front viewing angle may be S1, the brightness difference of the second-color light-emitting element P2 under the first large viewing angle and the front viewing angle may be S2, and the brightness difference of the third-color light-emitting element P3 under the first large viewing angle and the front viewing angle may be S3, where S1>S2>S3. That is, the brightness attenuation of the third-color light-emitting element P3 may be the smallest at the first viewing angle, and its brightness may be higher at the first viewing angle. In this embodiment, the thickness D13 of the third interlayer component 73 may be set to be larger than the thickness D12 of the second interlayer portion 72, and the thickness D12 of the second interlayer component 72 may be larger than the thickness D11 of the first interlayer component 71. Therefore, the thickness D03 of the corresponding second sub-section 52 corresponding to the third interlayer component 73 may be larger than the thickness D02 of the second sub-section 52 corresponding to the second interlayer part 72, and the thickness D02 of the second sub-section 52 corresponding to the second interlayer part 72 may be larger than the thickness D01 of the second sub-section 52 corresponding to the first interlayer component 71. The brightness difference of the light-emitting elements P of different colors under the first large viewing angle may be balanced, thereby helping to reduce or avoid the possibility of color shift of the display panel under the large viewing angle and improve the display effect at the large viewing angle.

Optionally, the interlayer components in this embodiment may be located in the optical component region. When the thickness of the interlayer components corresponding to the light-emitting elements of different colors in the optical component region is differentiated, it may be beneficial to reduce or avoid the possibility of color shift at the large viewing angle of the optical component region, to improve the display effect of the optical component region at a large viewing angle.

In the above embodiment, the brightness attenuation of the third-color light-emitting element P3 may be different from the brightness attenuation of the first-color light-emitting element P1 and the brightness attenuation of the second-color light-emitting element P2. In some other embodiments, the relationship between the brightness attenuation of the third-color light-emitting element P3, the brightness attenuation of the first-color light-emitting element P1 and the brightness attenuation of the second-color light-emitting element P2 may have some other relationship. For example, in one embodiment, as shown in FIG. 13 and FIG. 14 which show other cross-sectional view of the display panel in FIG. 1 along the BB direction, the first-color light-emitting elements P1, the second-color light-emitting elements P2, and the third-color light-emitting elements P3 in the display panel may have another relationship.

Figure 13:
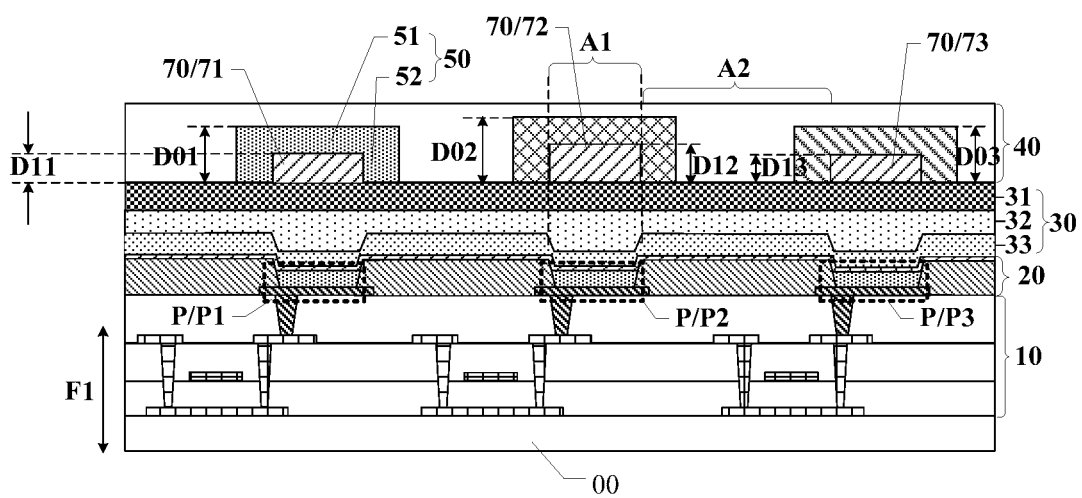
FIG. 13 illustrates another cross-sectional view of the display panel in FIG. 1 along a BB direction, consistent with various disclosed embodiments of the present disclosure.
Figure 14:
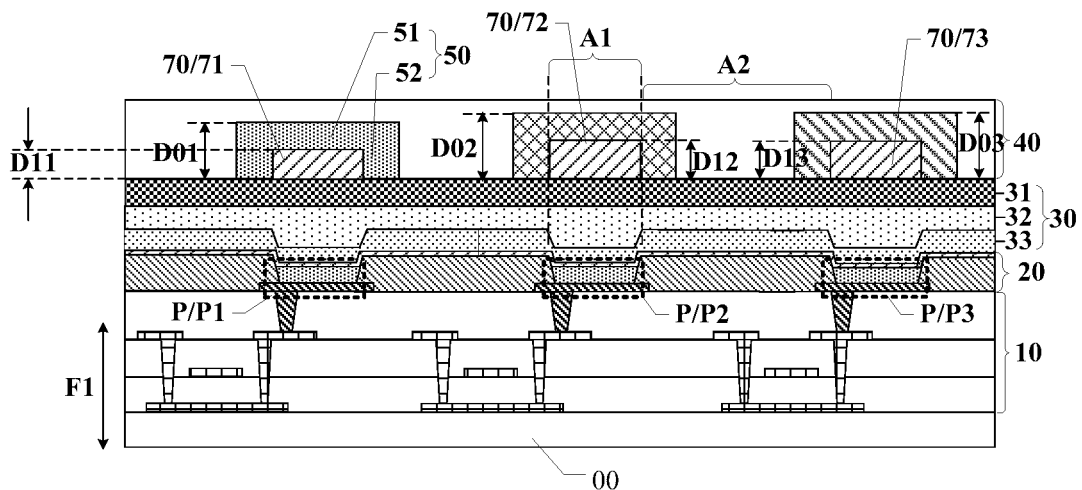
FIG. 14 illustrates another cross-sectional view of the display panel in FIG. 1 along a BB direction, consistent with various disclosed embodiments of the present disclosure.

As shown in FIG. 13 and FIG. 14, in one embodiment, one light-emitting element P in the display panel may further include a third light-emitting element P3. The light-emitting color of the third light-emitting element P3, the light-emitting color of the first light-emitting element P1, and the light-emitting color of the second light-emitting element P2 may be different from each other. One interlayer component 70 may further include a third interlayer component 73 overlapping with a corresponding third-color light-emitting element P3 along the first direction F1. Along the first direction, the thickness D13 of the third interlayer component 73 may be equal to the thickness D11 of the first interlayer component 71, or the thickness D13 of the third interlayer component 73 may be equal to the thickness D12 of the second interlayer component 72.

Optionally, when the third-color light-emitting elements P3 having the light-emitting color different from the first-color light-emitting elements P1 and the second-color light-emitting elements P2 are introduced into the display panel, the brightness difference of the first-color light-emitting element P1 under the first large viewing angle and the front viewing angle may be S1, the brightness difference of the second-color light-emitting element P2 under the first large viewing angle and the front viewing angle may be S2, and the brightness difference of the third-color light-emitting element P3 under the first large viewing angle and the front viewing angle may be S3. When S3=S1, the brightness attenuation of the third-color light-emitting element P3 may be equal to the brightness attenuation of the first-color light-emitting element P1. Correspondingly, the thickness D13 of the third interlayer component 73 corresponding to the third-color light-emitting element P3 may be set to be equal to the thickness D11 of the first interlayer portion 71 corresponding to the first-color light-emitting element P1. Therefore, the uniformity of display brightness of the first-color light-emitting element P1 and the third-color light-emitting element P3 under the large view angle may be improved, to prevent color shift of the display panel under the large view angle. When S3=S2, the brightness attenuation of the third-color light-emitting element P3 may be equal to the brightness attenuation of the second-color light-emitting element P2. Correspondingly, the thickness D13 of the third interlayer component 73 corresponding to the third-color light-emitting element P3 may be set to be equal to the thickness D12 of the second interlayer portion 72 corresponding to the second-color light-emitting element P2. Therefore, the uniformity of display brightness of the second-color light-emitting element P2 and the third-color light-emitting element P3 under the large view angle may be improved, to prevent color shift of the display panel under the large view angle.

Figure 15:
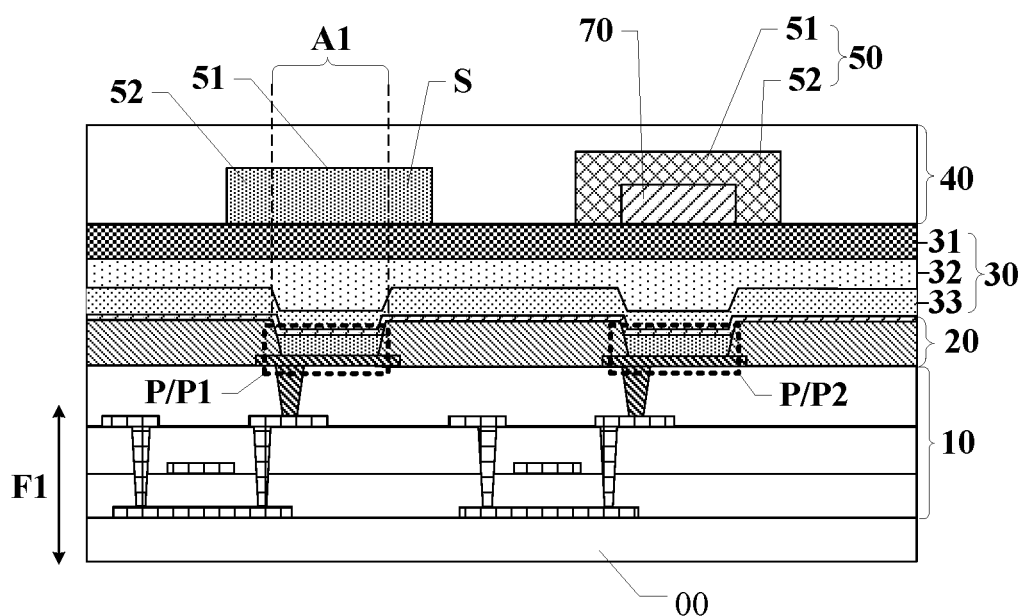
FIG. 15 illustrates another cross-sectional view of the display panel in FIG. 1 along a BB direction, consistent with various disclosed embodiments of the present disclosure.

In another embodiment shown in FIG. 15 which is another cross-sectional view of the display panel in FIG. 1 along the BB direction, one light-emitting element P may include a first-color light-emitting element P1 and a second-color light-emitting element P2. The first light-emitting element P1 and the second-color light-emitting element P2 may have different light-emitting colors. An interlayer component 70 may be provided at a side of one second-color light-emitting element P2 away from the substrate 00, and an interlayer component 70 may not be provided at a side of one first-color light-emitting element P1 away from the substrate 00.

Specifically, as shown in FIG. 15, the display panel may include light-emitting elements P with at least two different light-emitting colors, and interlayer components 70 may be provided between a portion of the light-emitting elements P and the first-type color-resists 50, and interlayer components 70 may not be provided between another portion of the light-emitting elements P and the first-type color-resists 50. Optionally, the brightness difference of the first-color light-emitting element P1 under the first large viewing angle and the front viewing angle may be S1, and the brightness difference of the second-color light-emitting element P2 under the first large viewing angle and the front viewing angle may be S2, where S1>S2. That is, the brightness attenuation of the first-color light-emitting element P1 at the first large viewing angle may be larger than the brightness attenuation of the second-color light-emitting element P2 at the first large viewing angle. Since the brightness attenuation of the first-color light-emitting element P1 at the first large viewing angle is relatively large, in the present embodiment, the interlayer component 70 may not be provided between the first-color light-emitting element P1 and the corresponding first-type color-resist 50, such that the thickness of the second sub-section 52 in the first-type color-resist 50 corresponding to the first-color light-emitting element P1 may be small. Therefore, the absorption of the light of the first-color light-emitting element P1 at the first large viewing angle by the corresponding second sub-section 52 may be small. Also, the brightness attenuation of the second-color light-emitting element P2 at the first large viewing angle may be relatively small, in the present embodiment, the interlayer component 70 may be provided between the second-color light-emitting element P2 and the corresponding first-type color-resist 50, such that the thickness of the second sub-section 52 in the first-type color-resist 50 corresponding to the second-color light-emitting element P2 may be increased. Therefore, a portion of the light of the second-color light-emitting element P2 at the first large viewing angle may be absorbed by the corresponding second sub-section 52. Therefore, the brightness difference of the first-color light-emitting element P1 and the second-color light-emitting element P2 under the first large viewing angle may be balanced, thereby helping to reduce or avoid the possibility of color shift of the display panel under the large viewing angle and improve the display effect at the large viewing angle.

In the present embodiment, an interlayer component 70 may not be provided at a side of one first-color light-emitting element P1 away from the substrate 00, that is, a thickness of an interlayer component 70 at a side of one first-color light-emitting element P1 away from the substrate 00 may be 0.

Optionally, the interlayer components in this embodiment may be located in the optical component region. When the interlayer components corresponding to the first-color light-emitting elements and the second-color light-emitting elements in the optical component region are differentiated, for example, an interlayer component may be provided at a side of one second-color light-emitting element away from the substrate and an interlayer component may not be provided at a side of one first-color light-emitting element away from the substrate, it may be beneficial to reduce or avoid the possibility of color shift at the large viewing angle of the optical component region, to improve the display effect of the optical component region at a large viewing angle.

Figure 16:
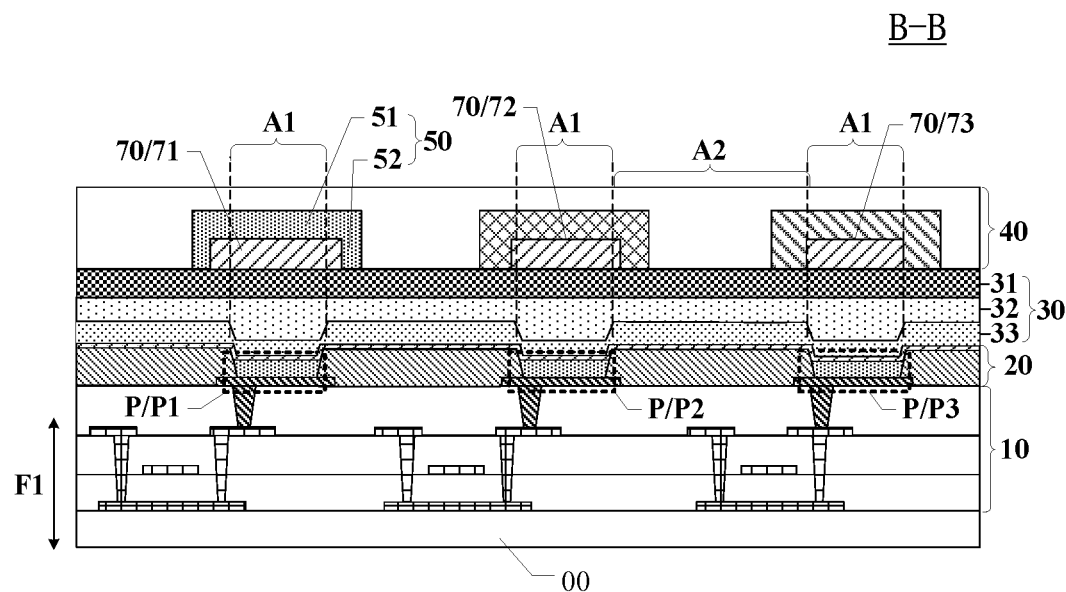
FIG. 16 illustrates another cross-sectional view of the display panel in FIG. 1 along a BB direction, consistent with various disclosed embodiments of the present disclosure.
Figure 17:
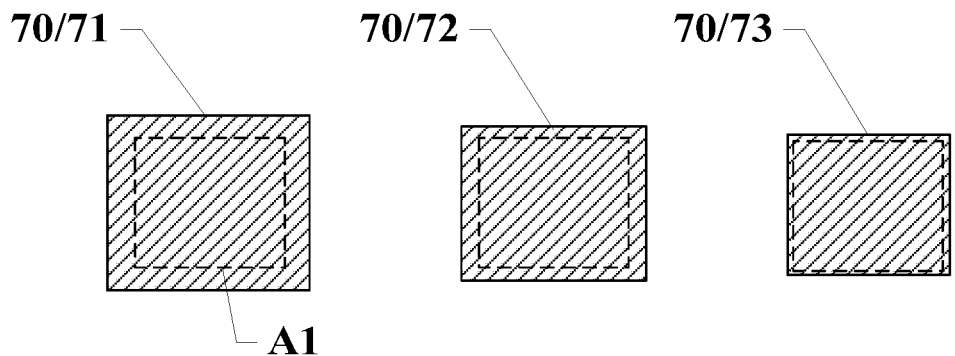
FIG. 17 illustrates a top view of intermediate layer components corresponding to different light-emitting elements in FIG. 16 consistent with various disclosed embodiments of the present disclosure.

In another embodiment shown in FIG. 16 which is another cross-sectional view of the display panel in FIG. 1 along the BB direction and FIG. 17 which is a top view of the interlayer components 70 corresponding to light-emitting elements P with different light-emitting colors in FIG. 16, one light-emitting element P may include a first-color light-emitting element P1 and a second-color light-emitting element P2. The first light-emitting element P1 and the second-color light-emitting element P2 may have different light-emitting colors. One interlayer component 70 may include a first interlayer component 71 overlapping a corresponding first-color light-emitting element P1 along the first direction F1, and a second interlayer component 72 overlapping a corresponding second-color light-emitting element P2 along the first direction F1. An area of an orthographical projection of the first interlayer component 71 to the substrate 00 may be larger than an area of an orthographical projection of the second interlayer component 72 to the substrate 00.

As shown in FIG. 16 and FIG. 17, the display panel may include first-color light-emitting elements P1 and second-color light-emitting elements P2 with different light-emitting colors. Optionally, the brightness difference of the first-color light-emitting element P1 under the first large viewing angle and the front viewing angle may be S1, and the brightness difference of the second-color light-emitting element P2 under the first large viewing angle and the front viewing angle may be S2, where S1>S2. That is, the brightness attenuation of the first-color light-emitting element P1 at the first large viewing angle may be larger than the brightness attenuation of the second-color light-emitting element P2 at the first large viewing angle. Since the interlayer component 70 has a structure with high transmittance, when at least part of the interlayer component 70 corresponding to one light-emitting element P extends into the non-opening area A2, a part of the light with a large viewing angle emitted by the light-emitting element P may be emitted through a portion of the interlayer component 70 in the non-opening area A2, and the light-emitting brightness of the light-emitting element P under a large viewing angle may be increased. Since the brightness attenuation of the first-color light-emitting element P1 at the first large viewing angle is relatively large, in the present embodiment, at least a portion of the interlayer component 70 corresponding to the first-color light-emitting element P1 may be configured to extend into the non-opening area A2, which is equivalent to increase the area of the orthographical projection of the first interlayer component 71 corresponding to the first-color light-emitting element P1 to the substrate 00. Therefore, at least a portion of the light emitted from the first-color light-emitting element P1 may be able to be emitted through the corresponding first interlayer component 71, to increase the light-emitting brightness of the first-color light-emitting element P1 under the first large viewing angle. Also, since the brightness attenuation of the second-color light-emitting element P2 at the first large viewing angle is relatively small, in the present embodiment, the second interlayer component 72 may completely cover the opening area A1 corresponding to the second-color light-emitting element P2. The area of the orthographical projection of the second interlayer component 72 corresponding to the second-color light-emitting element P2 to the substrate 00 may be configured to be smaller than the area of the orthographical projection of the first interlayer component 71 corresponding to the first-color light-emitting element P1 to the substrate 00. Therefore, the brightness difference of the first-color light-emitting element P1 and the second-color light-emitting element P2 under the first large viewing angle may be balanced, thereby helping to reduce or avoid the possibility of color shift of the display panel under the large viewing angle and improve the display effect at the large viewing angle.

As shown in FIG. 16 and FIG. 17, in some embodiment, when the third-color light-emitting elements P3 having the light-emitting color different from the first-color light-emitting elements P1 and the second-color light-emitting elements P2 are introduced into the display panel, the brightness difference of the third-color light-emitting element P3 under the first large viewing angle and the front viewing angle may be S3, and S3 may be smaller than S2. That is, the brightness attenuation of the third-color light-emitting element P3 may be the smallest at the first viewing angle, and its brightness may be higher at the first viewing angle. In this embodiment, the area of the orthographic projection of the third interlayer component 73 to the substrate 00 may be set to be the smallest, that is, an area of a portion of the third interlayer component 73 in the non-opening area A2 may be the smallest. Therefore, the amount of the light at the large view angle from the third-color light-emitting elements P3 emitted through the third interlayer components 73 in the non-opening area A2 may be reduced, and may be smaller than the amount of the light at the large view angle from the second-color light-emitting elements P2 emitted through the second interlayer components 72 in the non-opening area A2. The areas of the interlayer components corresponding to different light-emitting elements P with different colors may be designed differently, to balance the brightness difference of the light-emitting elements P of different colors under the first large viewing angle, thereby helping to reduce or avoid the possibility of color shift of the display panel under the large viewing angle and improve the display effect at the large viewing angle.

In some other embodiments, S3=S2, and the area of the third interlayer components 73 corresponding to the third-color light-emitting elements P3 may be set to be equal to the area of the second interlayer components 72 corresponding to the second-color light-emitting elements P2. Or S3=S1, and the area of the third interlayer components 73 corresponding to the third-color light-emitting elements P3 may be set to be equal to the area of the first interlayer components 71 corresponding to the first-color light-emitting elements P1. The areas of the interlayer components corresponding to different light-emitting elements P with different colors may be designed flexibly according to the brightness attenuation of the light-emitting elements P with different colors under the first large viewing angle and the front view angle, to balance the brightness difference of the light-emitting elements P of different colors under the first large viewing angle, thereby helping to reduce or avoid the possibility of color shift of the display panel under the large viewing angle and improve the display effect at the large viewing angle.

Optionally, the interlayer components in this embodiment may be located in the optical component region. When areas of the interlayer components corresponding to different light-emitting elements P with different colors may be designed differently, it may be beneficial to reduce or avoid the possibility of color shift at the large viewing angle of the optical component region, to improve the display effect of the optical component region at a large viewing angle.

Figure 18:
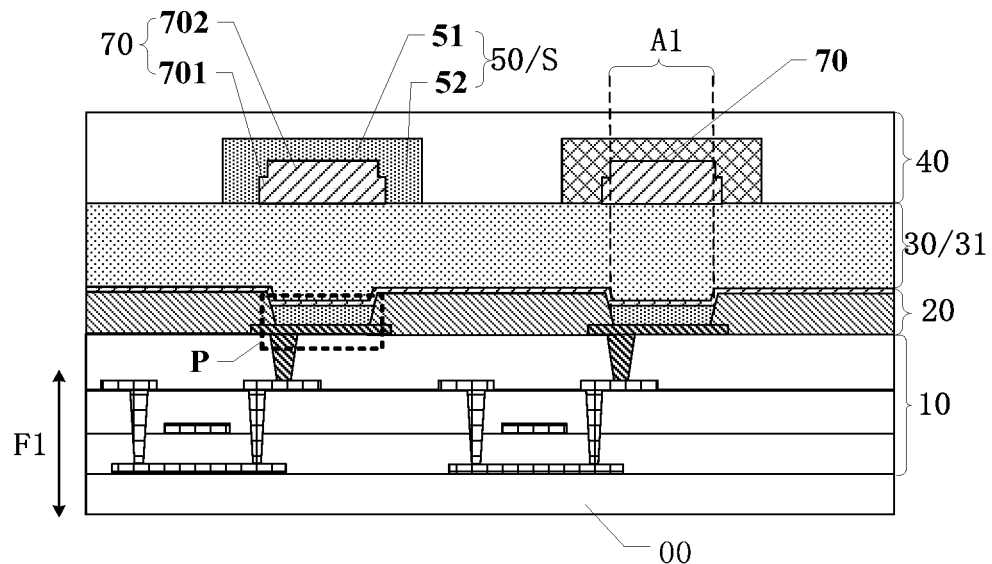
FIG. 18 illustrates another cross-sectional view of the display panel in FIG. 1 along a BB direction, consistent with various disclosed embodiments of the present disclosure.

The above embodiments where the interlayer components have regular shapes are used as examples to illustrate the present disclosure, and do not limit the scopes of the present disclosure. In some other embodiments, one interlayer component 70 may have a form that the upper edge has a stepped structure. For example, in one embodiment shown in FIG. 18 which is another cross-sectional view of the display panel in FIG. 1 along the BB direction, along the first direction, the interlayer component 70 may include a first sub-component 701 and at least one second sub-component 702 arranged in layers. The first sub-component 701 may be located between the light-emitting layer 20 and the at least one second sub-component 702. An area of an orthographic projection of the at least one second sub-component 702 on the substrate 00 may be smaller than an area of an orthographic projection of the first sub-component 701 on the substrate 00.

Specifically, in one embodiment, the interlayer component 70 includes a first sub-component 701 and a second sub-component 702 arranged in layers. The area of the orthographic projection of the first sub-component 701 on the plane where the substrate 00 is located may be relatively large, and the area of the orthographic projection of the second sub-component 702 on the plane where the substrate 00 is located may be small. Since the second sub-component 702 is located on the side of the first sub-component 701 away from the light-emitting layer 20, a stepped structure may be formed on the side of the interlayer component 70 away from the light-emitting layer 20. When the corresponding color-resist S is deposited on the side of the interlayer component 70 away from the light-emitting layer 20, since the corresponding color-resist S has fluidity, the step structure may play a role in draining the corresponding color-resist S such that a portion of the color corresponding color-resist S flows to the side of the interlayer component 70. Therefore, the corresponding second sub-section 52 with a larger thickness is formed on the side of the interlayer component 70, and the corresponding first sub-section 51 with a smaller thickness may be formed directly above the interlayer part 70. Correspondingly, the second sub-section 52 with a larger thickness may be able to play a better role in reducing reflection and improve the display quality of the display panel. At the same time, the light loss of the light emitted by the corresponding light-emitting element P may be smaller when passing through the corresponding first sub-section 51 with a smaller thickness, which is beneficial to avoid the increase in the power consumption of the display panel.

Optionally, in one embodiment, the geometric center of the first sub-component 701 and the geometric center of the second sub-component 702 may be coincident, such that a step structure may be formed around the side of the interlayer component 70 facing away from the light-emitting layer 20. When depositing the corresponding color-resist S, since the corresponding color-resist S has a certain fluidity, the step structure on the interlayer component 70 may play an auxiliary leveling role for the corresponding color-resist S, to help the corresponding color-resist S to flow to the side of the interlayer component 70, such that the corresponding second sub-sections 52 with larger thickness may be formed on each side surface of the interlayer component 70, which is more beneficial to improve the anti-reflection effect.

In one optional embodiment, along the first direction, the second sub-component 702 may cover the corresponding opening area A1 to ensure that the thickness of the portion of the interlayer component 70 that overlaps the corresponding light-emitting element P is uniform. Therefore, the light emitted by the corresponding light-emitting element P at the front view angle may have the same light loss when passing through the interlayer component 70, to ensure the uniformity of light output at the front view angle of the corresponding light-emitting element.

Optionally, the first sub-component 701 and the second sub-component 702 in the interlayer component 70 may be in direct contact, and no other film layer may be disposed therebetween. Optionally, the first sub-component 701 and the second sub-component 702 may be integrally formed.

Figure 19:
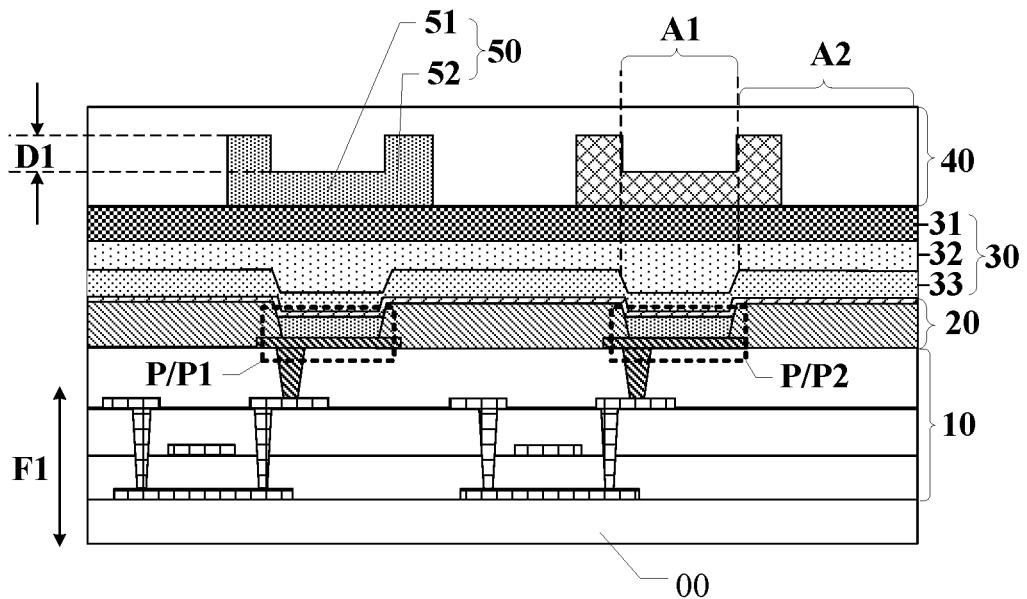
FIG. 19 illustrates another cross-sectional view of the display panel in FIG. 1 along a BB direction, consistent with various disclosed embodiments of the present disclosure.

In another embodiment shown in FIG. 19 which is another cross-sectional view of the display panel in FIG. 1 along the BB direction, the first-type color-resists 50 may be implemented in another manner. As shown in FIG. 19, for at least a portion of the first-type color-resists 50, a surface of the first sub-sections 51 towards the substrate 00 may be flush with a surface of the second sub-sections 52 towards the substrate 00.

Specifically, in the display panel provided by the present embodiment, a portion of the first-type color-resists 50 in the color filter layer 40 may also be embodied as the structures shown in FIG. 19. That is, in one same first-type color-resist 50, surfaces of the first sub-section 51 and the second sub-section 52 facing the substrate 00 may be coplanar, and the integral structure of the same first-type color-resist 50 may form a structure similar to a "concave" shape. When fabricating the first-type color-resist 50 with this structure, a color-resist with a uniform thickness may be formed in the corresponding opening area A1 and a portion of the non-opening area A2 around the corresponding opening area A1 by vapor deposition, and then an additional layer of color-resist may be formed in the non-opening area A2 by vapor deposition, such that the first sub-section 51 with a smaller thickness may be formed in the corresponding opening area A1 and the second sub-section 52 with a larger thickness may be formed in the non-opening area A2. The thick second sub-section 52 may also absorb the light incident from the outside, which is beneficial to reduce the reflectivity of the area where the first-type color-resist 50 is arranged in the display panel and is also beneficial to improve the contrast ratio of the display panel. Therefore, the display quality may be improved. During display, some of the light emitted by the corresponding light-emitting element P may be emitted through the first sub-section 51 in the first-type color-resist 50. When the thickness of the first sub-section 51 located in the corresponding opening area A1 in the first-type color-resist 50 is designed to be smaller, the light loss of the light emitted by the corresponding light-emitting element when passing through the first sub-section 51 with the smaller thickness may be smaller. The overall display brightness of the display panel may have small attenuation, which is beneficial to avoid an increase in the power consumption of the display panel.

Optionally, the above-mentioned first-type color-resist 50 may be located in the optical component region AA2. Since the optical component region AA2 has higher requirements on transmittance, as the transmittance increases, the reflectance may also be higher. When the first-type color-resist 50 is disposed in the optical component region AA2, the second sub-sections 52 in the first-type color-resist 50 may absorb the external light to a certain extent, which is beneficial to reduce the reflectivity in the optical component region AA2. The display effect of the optical component region AA2 in the display stage may be improved.

In one optional embodiment, in one same first-type color-resist 50, the difference between the thicknesses of the first sub-section 51 and the second sub-section 52 may be D1, and $0.5\ \mu m \le D1 \le 2\ \mu m$.

When the first-type color-resist 50 adopts a "concave" structure as shown in FIG. 19, the thickness difference between the first sub-section 51 and the second sub-section 52 may have an influence on the anti-reflection effect or process. When the difference between the thicknesses of the first sub-section 51 and the second sub-section 52 is less than 0.5 m and the thickness of the first sub-section 51 is able to ensure the required thickness of the light extraction rate, the thickness of the second sub-section 52 of the first-type color-resist 50 in the non-opening area A2 may be relatively low, affecting the anti-reflection effect of the second sub-section 52. When the difference between the thicknesses of the first sub-section 51 and the second sub-section 52 is larger than 2 m and the thickness of the first sub-section 51 is able to ensure the required thickness of the light extraction rate, the thickness of the second sub-section 52 will be too large, causing a high risk in the process. Therefore, in the present embodiment, the difference between the thicknesses of the first sub-section 51 and the second sub-section 52 may be set between 0.5 m and 2 m, which is beneficial to ensure that the thickness of the second sub-section 52 can achieve a better anti-reflection effect. At the same time, the problem of high process risk caused by the excessive thickness of the second sub-section 52 may also be avoided.

Optionally, $0.6\ \mu m \le D1 \le 1.8\ \mu m$, or, $0.8\ \mu m \le D1 \le 1.5\ \mu m$, or, $1\ \mu m \le D1 \le 1.6\ \mu m$, and so on.

Figure 20:
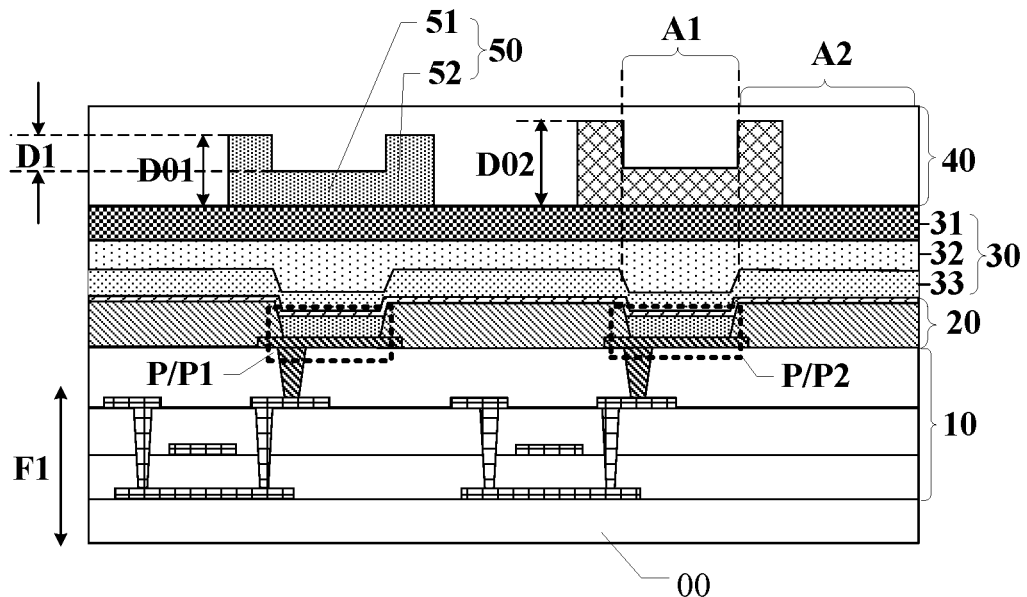
FIG. 20 illustrates another cross-sectional view of the display panel in FIG. 1 along a BB direction, consistent with various disclosed embodiments of the present disclosure.

In another embodiment shown in FIG. 20 which is another cross-sectional view of the display panel in FIG. 1 along the BB direction, the thickness of different second sub-sections 52 corresponding to the light-emitting elements P with different colors may be different. As shown in FIG. 20, in one embodiment, one light-emitting element P may include one first-color light-emitting element P1 and a second-color light-emitting element P2. The first-color light-emitting element P1 and the second-color light-emitting element P2 may have different light-emitting colors. In one first-type color-resist 50 overlapping with the first-color light-emitting element P1 along the first direction F1, the thickness of the corresponding second sub-section 52 may be D01. In one first-type color-resist 50 overlapping with the second-color light-emitting element P2 along the first direction F1, the thickness of the corresponding second sub-section 52 may be D02. D01<D02.

The display panel may include first-color light-emitting elements P1 and second-color light-emitting elements P2 with different light-emitting colors. The brightness difference of one first-color light-emitting element P1 under the first large viewing angle and the front viewing angle is S1, and the brightness difference of one second-color light-emitting element P2 under the first large viewing angle and the front viewing angle is S2, where S1>S2. That is, the brightness attenuation of the first-color light-emitting element P1 under the first large viewing angle may be larger than the brightness attenuation of the second-color light-emitting element P2 at the first viewing angle. Since the second sub-section 52 of the first-type color-resist 50 is disposed in the non-display region AA, a part of the large-angle light emitted by the corresponding light-emitting element P may be absorbed by the second sub-section 52. That is, the thickness of the second sub-section 52 may affect the brightness of the corresponding light-emitting element P at a large viewing angle. When the brightness attenuation of the first-color light-emitting element P1 under the first large viewing angle is relatively large and the brightness attenuation of the second-color light-emitting element P2 under the first large viewing angle is relatively small, in the present embodiment, the thickness D01 of the second sub-section 52 in the first-type color-resist 50 corresponding to the first-color light-emitting element P1 may be set to be smaller than the thickness D02 of the second sub-section 52 in the first-type color resistance 50 corresponding to the second-color light-emitting element P2. Therefore, the amount of light absorbed by the second sub-section 52 for the corresponding first-color light-emitting element P1 at the first large viewing angle may be appropriately decreased, and the amount of light absorbed by the second sub-section 52 for the corresponding second-color light-emitting element P2 under the first large viewing angle may be appropriately increased. The brightness of the first-color light-emitting element P1 and the second-color light-emitting element P2 under the first large viewing angle may be balanced, which is beneficial to reduce or avoid the possibility of color shift of the display panel under the large viewing angle. The overall display quality of the display panel in the large viewing angle may be improved.

Figure 21:
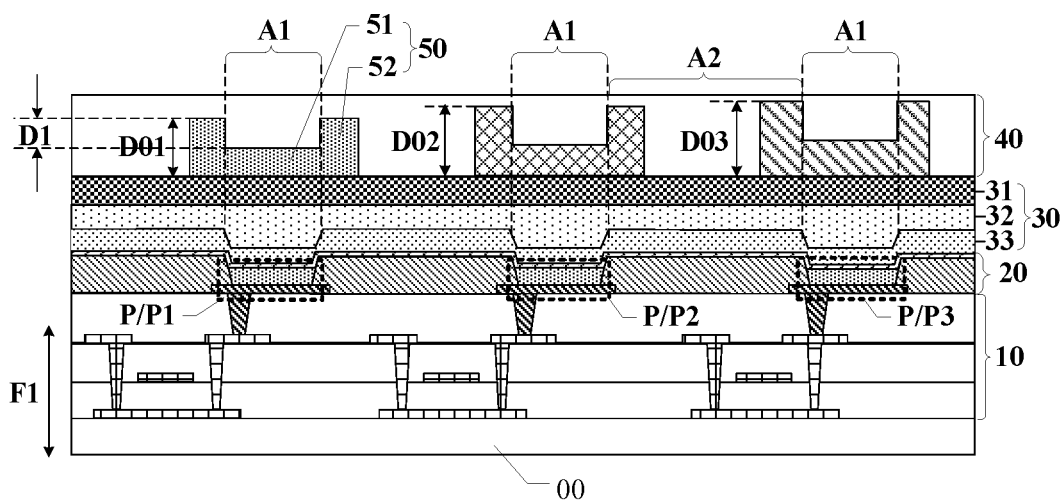
FIG. 21 illustrates another cross-sectional view of the display panel in FIG. 1 along a BB direction, consistent with various disclosed embodiments of the present disclosure.

In another embodiment shown in FIG. 21 which is another cross-sectional view of the display panel in FIG. 1 along the BB direction, the display panel may include the light-emitting elements P with three different light-emitting colors and the first-type color-resists 50 corresponding to the light-emitting elements P with different colors may be different. As shown in FIG. 21, one light-emitting element P may further include a third-color light-emitting element P3. The light-emitting color of the third light-emitting element P3, the light-emitting color of the first light-emitting element P1, and the light-emitting color of the second light-emitting element P2 may be different from each other. In one first-type color-resist 50 overlapping with the third-color light-emitting element P3 along the first direction F1, the thickness of the corresponding second sub-section 52 may be D03, where D03>D02.

As shown in FIG. 21, when the third-color light-emitting elements P3 having the light-emitting color different from the first-color light-emitting elements P1 and the second-color light-emitting elements P2 are introduced into the display panel, the brightness difference of the first-color light-emitting element P1 under the first large viewing angle and the front viewing angle may be S1, the brightness difference of the second-color light-emitting element P2 under the first large viewing angle and the front viewing angle may be S2, and the brightness difference of the third-color light-emitting element P3 under the first large viewing angle and the front viewing angle may be S3, where S1>S2>S3. That is, the brightness attenuation of the third-color light-emitting element P3 may be the smallest at the first large viewing angle, and its brightness may be higher at the first large viewing angle. The brightness attenuation of the first-color light-emitting element P1 may be the largest at the first large viewing angle, and its brightness may be lower at the first large viewing angle. The thickness of the second sub-sections 52 in the first-type light blockers 50 corresponds to the first-color light-emitting element P1, the second-color light-emitting element P2, and the third-color light-emitting element P3, may be designed differentially. The thickness D03 of the second sub-section 52 corresponding to the third-color light-emitting element P3 may be set to be the largest, and the thickness D01 of the second sub-section 52 corresponding to the first-color light-emitting element P1 may be set to be the smallest, that is, D03>D02>D01. Therefore, the thicker second sub-section 52 may block more light emitted from the third-color light-emitting element P3 at the first large viewing angle, and the thinner second sub-section 52 may block less light emitted from the first-color light-emitting element P1 at the first large viewing angle. The brightness difference of the light-emitting elements P of different colors under the first large viewing angle may be balanced, thereby helping to reduce or avoid the possibility of color shift of the display panel under the large viewing angle and improve the display effect at the large viewing angle.

When the above first-type blocker 50 is located in the optical component region AA2, the display quality of the optical component region AA2 at the large viewing angle may be improved. When the above first-type blocker 50 is located in the first display region AA1, the display quality of the first display region AA1 at the large viewing angle may be improved.

Figure 22:
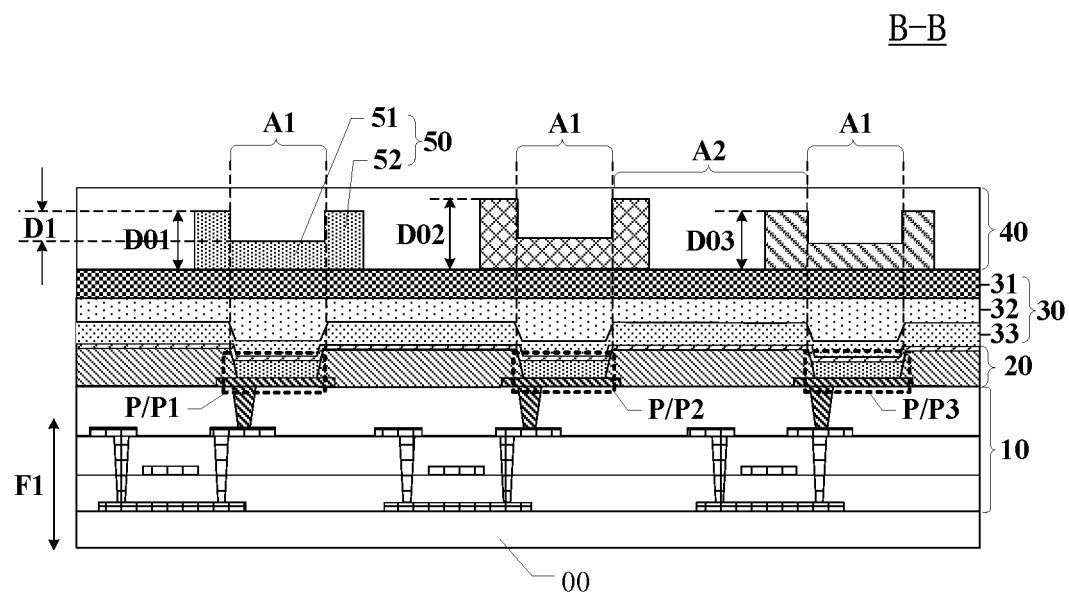
FIG. 22 illustrates another cross-sectional view of the display panel in FIG. 1 along a BB direction, consistent with various disclosed embodiments of the present disclosure.
Figure 23:
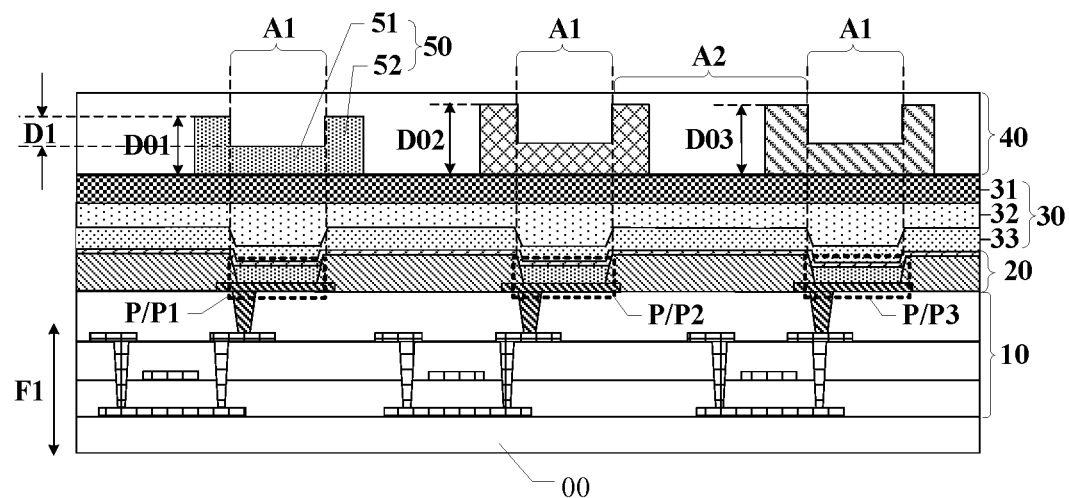
FIG. 23 illustrates another cross-sectional view of the display panel in FIG. 1 along a BB direction, consistent with various disclosed embodiments of the present disclosure.

In another embodiment shown in FIG. 22 and FIG. 23 which respectively show another cross-sectional view of the display panel in FIG. 1 along the BB direction, the display panel may include the light-emitting elements P with three different light-emitting colors and the first-type color-resists 50 corresponding to the light-emitting elements P with different colors may be different. As shown in FIG. 21, one light-emitting element P may further include a third-color light-emitting element P3. The light-emitting color of the third light-emitting element P3, the light-emitting color of the first light-emitting element P1, and the light-emitting color of the second light-emitting element P2 may be different from each other. In one first-type color-resist 50 overlapping with the third-color light-emitting element P3 along the first direction F1, the thickness of the corresponding second sub-section 52 may be D03. D03=D01 or D03=D02.

When the third-color light-emitting elements P3 having the light-emitting color different from the first-color light-emitting elements P1 and the second-color light-emitting elements P2 are introduced into the display panel, the brightness difference of the first-color light-emitting element P1 under the first large viewing angle and the front viewing angle may be S1, the brightness difference of the second-color light-emitting element P2 under the first large viewing angle and the front viewing angle may be S2, and the brightness difference of the third-color light-emitting element P3 under the first large viewing angle and the front viewing angle may be S3. In the embodiment shown in FIG. 22, S1=S3. That is, the brightness attenuation of the third-color light-emitting element P3 at the first large viewing angle may be same as the brightness attenuation of the first-color light-emitting element P1 at the first large viewing angle. The thickness D03 of the second sub-section 52 corresponding to the third-color light-emitting element P3 may be set to be same as the thickness D01 of the second sub-section 52 corresponding to the first-color light-emitting element P1, that is, D03=D01. Therefore, the light absorption of these two second sub-sections 52 for the light emitted from the corresponding first-color light-emitting element P1 and the corresponding third-color light-emitting element P3 may be approximately same or close. Therefore, the uniformity of display brightness of the first-color light-emitting element P1 and the third-color light-emitting element P3 under the large view angle may be improved, to prevent color shift of the display panel under the large view angle. In the embodiment shown in FIG. 23, the brightness difference S3 of the third-color light-emitting element P3 under the first large viewing angle and the front viewing angle may be equal to the brightness difference S2 of the second-color light-emitting element P2 under the first large viewing angle and the front viewing angle, that is, S3=S2. Correspondingly, the brightness attenuation of the third-color light-emitting element P3 may be equal to the brightness attenuation of the second-color light-emitting element P2 under the first large viewing angle. The thickness D03 of the second sub-section 52 corresponding to the third-color light-emitting element P3 may be set to be same as the thickness D02 of the second sub-section 52 corresponding to the second-color light-emitting element P2, that is, D03=D02. Therefore, the light absorption of these two second sub-sections 52 for the light emitted from the corresponding second-color light-emitting element P2 and the corresponding third-color light-emitting element P3 may be approximately same or close. Therefore, the uniformity of display brightness of the second-color light-emitting element P2 and the third-color light-emitting element P3 under the large view angle may be improved, to prevent color shift of the display panel under the large view angle. The overall display quality of the display panel may be improved.

As shown in FIG. 4, in one embodiment, in one same first-type color-resist 50, the second sub-sections 52 may be arranged around the first sub-sections 51. Correspondingly, the second sub-sections 52 may be arranged around the first sub-section 51 corresponding to the same light-emitting element P, and the second sub-sections 52 may absorb the light emitted by the corresponding light-emitting element P with the same large viewing angle to the same or similar degree. When the display panel is observed under the same large viewing angle at different positions, the display effect of the display panel may be relatively uniform, which is beneficial to improve the display uniformity of the display panel under the same large viewing angle at different positions.

Figure 24:
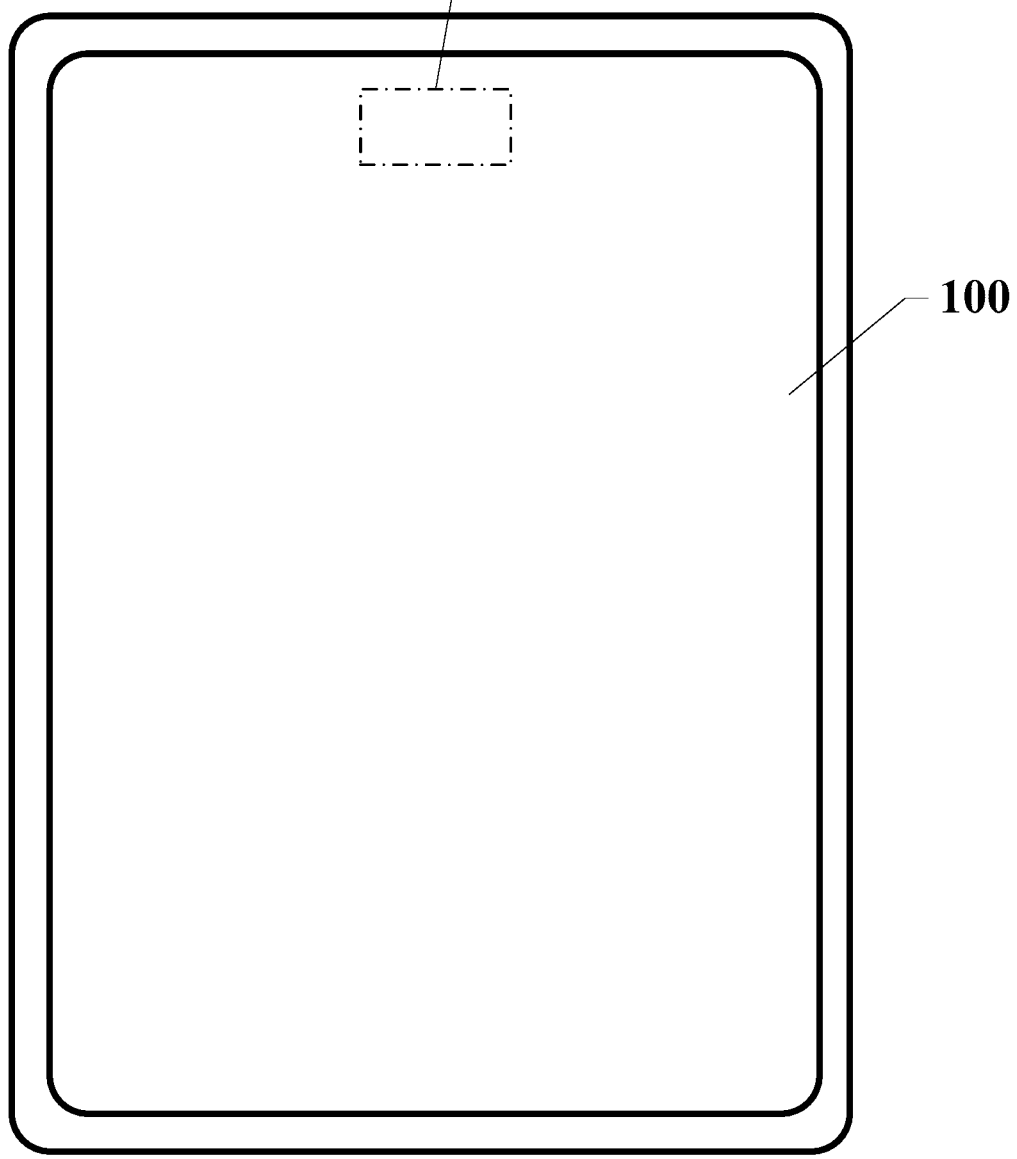
FIG. 24 illustrates an exemplary display device consistent with various disclosed embodiments of the present disclosure.

The present disclosure also provides a display device. As shown in FIG. 24, in one embodiment, the display device 200 may include any display panel 100 provided by various embodiments of the present disclosure.

In the present disclosure, the display device 200 may be any display device with display function, such as a computer, a cell phone, or a tablet. The display device provided by the present disclosure may have advantages same as the display panels provided by the present disclosure.

In one embodiment, as shown in FIG. 24, the display device may further include a photosensitive component 80, and the photosensitive component 80 may be located in the optical component region AA2 of the display panel. Optionally, the photosensitive component 80 included in the display device 200 may be an electronic photosensitive device such as a camera, an infrared sensor device, or a fingerprint identification device. In the display stage, the optical component region AA2 may be used to perform a display function. In the photosensitive stage, the photosensitive component 80 in the optical component region AA2 may be used for sensing light. Optionally, in the present embodiment, the first-type color-resists may be introduced into the optical component region, and the second sub-sections in the first-type color-resists may reduce the reflectivity in the optical component region. At the same time, the light with a large viewing angle may be balanced, thereby improving the overall display uniformity of the display panel and improving the display quality.

In the display panel and display device provided by various embodiments of the present disclosure, the plurality of light-emitting elements may be arranged on the light-emitting layer. The plurality of light-emitting elements may be located in the opening areas, and the color filter layer may be arranged on the side of the light-emitting layer away from the substrate. One color-resist in the color filter layer may include the first sub-section and the second sub-section. The first sub-section may be located in the corresponding opening area, and the second sub-section may be located in the non-opening area. The thicknesses of the first sub-section and the second sub-section in one same first-type color-resist may be designed differently, such that the thickness of the first sub-section is smaller than the thickness of the second sub-section. When the thickness of the second sub-section located in the non-open area of the first-type color-resist is designed to be larger, when the external light hits the position corresponding to the second sub-section, the second sub-section may absorb the external light to reduce or avoid the reflection of light. Therefore, the thick second sub-section may be able to play a better role in reducing reflection. When the reflectivity of the display panel and the display device is reduced, the contrast may naturally be improved, therefore improving the display quality of the display panel and the display device.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A display panel, comprising:
a display region including a plurality of opening areas and a non-opening area;
a substrate;
a light-emitting layer and a color filter layer on a side of the substrate,
wherein:
the light-emitting layer is disposed between the substrate and the color filter layer;
the light-emitting layer includes a plurality of light-emitting elements located in the plurality of opening areas;
the color filter layer includes a plurality of color-resists;
along a first direction, one of the plurality of color-resists overlaps with a corresponding one of the plurality of light-emitting elements;
one of the plurality of color-resists includes a first sub-section and a second sub-section, wherein the first sub-section is located in a corresponding one of the plurality of opening areas and the second sub-section is located in the non-opening area;
the plurality of color-resists includes a first-type color-resist; and
in the first-type color-resist, along the first direction, a thickness of the first sub-section is smaller than a thickness of the second sub-section, wherein the first direction is a thickness direction of the display panel.

2. The display panel according to claim 1, wherein the first sub-section completely covers a corresponding one of the plurality of opening areas along the first direction.

3. The display panel according to claim 1, wherein:
the display region includes a first display region and an optical component region; and
the first-type color-resist is disposed in the optical component region.

4. The display panel according to claim 3, wherein:
in color-resists with a same color of the plurality of color resists, along the first direction, the thickness of the first sub-section in one of the color-resists in the optical component region is the same as the thickness of one of the color-resists in the first display region that overlaps with a corresponding one of the plurality of light-emitting elements.

5. The display panel according to claim 1, further comprising an interlayer component, wherein:

the interlayer component is disposed between a corresponding first-type color-resist and the light-emitting layer; and
the interlayer component overlaps with a corresponding first sub-section.

6. The display panel according to claim 5, wherein:
the interlayer component includes a first surface and a second surface disposed facing away from each other along the first direction, and a side surface disposed at a side of the first surface and the second surface;
the first surface is located on a side of the second surface away from a corresponding one of the plurality of light-emitting elements; and
the first surface and the side surface of the interlayer component are covered by a corresponding one of the plurality of color-resists.

7. The display panel according to claim 5, wherein:
a transmittance of the interlayer component is larger than a transmittance of a corresponding first sub-section.

8. The display panel according to claim 5, wherein:
in a same first-type color-resist, along the first direction, a sum of the thicknesses of the first sub-section and the interlayer component is equal to the thickness of the second sub-section.

9. The display panel according to claim 5, further comprising an encapsulation layer between the color filter layer and the light-emitting layer, wherein:
the interlayer component is disposed between the encapsulation layer and the first sub-section;
the encapsulation layer includes a first encapsulation layer adjacent to the color-resists; and
a difference between refractive indices of the interlayer component and the first encapsulation layer is $\Delta n0$, wherein $|\Delta n0|<0.15$.

10. The display panel according to claim 5, further comprising an encapsulation layer between the color filter layer and the light-emitting layer, wherein:
an interlayer component is disposed between the encapsulation layer and a corresponding first sub-section;
the encapsulation layer includes a first encapsulation layer adjacent to the color-resists;
a light-emitting element of the plurality of light-emitting elements includes a first-color light-emitting element and a second-color light-emitting element;
the first-color light-emitting element and the second-color light-emitting element have different light-emitting colors;
a difference between refractive indices of the interlayer component overlapping with the first-color light-emitting element along the first direction and the first encapsulation layer is $\Delta n1$;
a difference between refractive indices of the interlayer component overlapping with the second-color light-emitting element along the first direction and the first encapsulation layer is $\Delta n2$;
and
$|\Delta n1|<|\Delta n2|$.

11. The display panel according to claim 5, further comprising an encapsulation layer between the color filter layer and the light-emitting layer, wherein:
an interlayer component is disposed between the encapsulation layer and a corresponding first sub-section;
the encapsulation layer includes a first encapsulation layer adjacent to a corresponding one of the plurality of color-resists; and
the interlayer component and the first encapsulation layer are made of a same material.

12. The display panel according to claim 5, wherein:
a light-emitting element of the plurality of light-emitting elements includes a first-color light-emitting element and a second-color light-emitting element;
the first-color light-emitting element and the second-color light-emitting element have different light-emitting colors;
the interlayer component includes a first interlayer component overlapping a corresponding first-color light-emitting element along the first direction and a second interlayer component overlapping a corresponding second light-emitting element along the first direction; and
along the first direction, a thickness of the first interlayer component is smaller than a thickness of the second interlayer component.

13. The display panel according to claim 5, wherein:
a light-emitting element of the plurality of light-emitting elements includes a first-color light-emitting element and a second-color light-emitting element;
the first-color light-emitting element and the second-color light-emitting element have different light-emitting colors; and
one interlayer component is provided at a side of the corresponding second-color light-emitting element and no interlayer component is provided at a side of the corresponding first color light-emitting element.

14. The display panel according to claim 5, wherein:
a light-emitting element of the plurality of light-emitting elements includes a first-color light-emitting element and a second-color light-emitting element;
the first-color light-emitting element and the second-color light-emitting element have different light-emitting colors;
an interlayer component includes a first interlayer component overlapping a corresponding first-color light-emitting element along the first direction and a second interlayer component overlapping a corresponding second light-emitting element along the first direction; and
an area of an orthographic projection of the first interlayer component on the substrate is larger than an area of an orthographic projection of the second interlayer component on the substrate.

15. The display panel according to claim 5, wherein:
in the first direction, an interlayer component includes a first sub-component and at least one second sub-component arranged in layers;
the first sub-component is located between the light-emitting layer and the at least one second sub-component; and
an area of an orthographic projection of the at least one second sub-component on the substrate is smaller than an area of an orthographic projection of the first sub-component on the substrate.

16. The display panel according to claim 1, wherein:
in at least a portion of the first-type color-resists, surfaces of first sub-sections facing the substrate are flush with surfaces of second sub-sections facing the substrate; and
in the first-type color-resist, a thickness difference between the first sub-section and the second sub-section is D1, wherein $0.5\ \mu m \leq D1 \leq 2\ \mu m$.

17. The display panel according to claim 1, wherein:
a light-emitting element of the plurality of light-emitting elements includes a first-color light-emitting element and a second-color light-emitting element;

the first-color light-emitting element and the second-color light-emitting element have different light-emitting colors;

in a first-type color-resist overlapping with a corresponding first-color light-emitting element in the first direction, a thickness of the second sub-section is D01;

in a first-type color-resist overlapping with a corresponding second-color light-emitting element in the first direction, a thickness of the second sub-section is D02; and

D01<D02.

18. The display panel according to claim 1, wherein:
in a same first-type color-resist, the second sub-section is disposed around the first sub-section.

19. A display device, comprising a display panel, wherein the display panel includes:
a display region including a plurality of opening areas and a non-opening area;
a substrate;
a light-emitting layer and a color filter layer on a side of the substrate,
wherein:
the light-emitting layer is disposed between the substrate and the color filter layer;
the light-emitting layer includes a plurality of light-emitting elements located in the plurality of opening areas;
the color filter layer includes a plurality of color-resists;
along a first direction, one of the plurality of color-resists overlaps with a corresponding one of the plurality of light-emitting elements;
one of the color-resists includes a first sub-section and a second sub-section, wherein the first sub-section is located in a corresponding one of the plurality of opening areas and the second sub-section is located in the non-opening area;
the plurality of color-resists includes a first-type color-resist; and
in the first-type color-resist, along the first direction, the thickness of the first sub-section is smaller than a thickness of the second sub-section, wherein the first direction is a thickness direction of the display panel.

20. The display device according to claim 19, further including a photosensitive element, wherein the photosensitive element overlaps with an optical component region of the display panel along a first direction.

* * * * *